United States Patent
Al-Amri

(10) Patent No.: US 11,480,350 B2
(45) Date of Patent: Oct. 25, 2022

(54) ENHANCED PERFORMANCE THERMOELECTRIC GENERATOR

(71) Applicant: Imam Abdulrahman Bin Faisal University, Dammam (SA)

(72) Inventor: Fahad G. Al-Amri, Dammam (SA)

(73) Assignee: Imam Abdulrahman Bin Faisal University, Dammam (SA)

(*) Notice: Subject to any disclaimer, the term of this patent is extended or adjusted under 35 U.S.C. 154(b) by 255 days.

(21) Appl. No.: 16/654,302

(22) Filed: Oct. 16, 2019

(65) Prior Publication Data
US 2020/0248913 A1 Aug. 6, 2020

Related U.S. Application Data

(60) Provisional application No. 62/799,273, filed on Jan. 31, 2019.

(51) Int. Cl.
*F24F 5/00* (2006.01)
*F28D 15/02* (2006.01)
(Continued)

(52) U.S. Cl.
CPC ............ *F24F 5/0046* (2013.01); *F24S 20/30* (2018.05); *F24S 40/55* (2018.05);
(Continued)

(58) Field of Classification Search
CPC F24S 40/55; F24S 20/30; H02S 40/40; H02S 40/42; H02S 40/425; H02S 40/44;
(Continued)

(56) References Cited

U.S. PATENT DOCUMENTS 5,451,352 A * 9/1995 Cook ...................... B29C 39/02
264/102
6,504,720 B2 * 1/2003 Furuya ................ F28D 15/0233
361/689
(Continued)

FOREIGN PATENT DOCUMENTS

CN 101876480 A 11/2010
CN 101876482 A 11/2010
(Continued)

OTHER PUBLICATIONS

Fahad Al-Amri, et al., "An Experrmental Study of Solar Panel Performance Using Heat Pipe and Thermoelectric Generator", International Journal of Renewable Energy Research, vol. 9, No. 3, Sep. 2019, pp. 1418-1427.
(Continued)

*Primary Examiner* — Jianying C Atkisson
*Assistant Examiner* — For K Ling
(74) *Attorney, Agent, or Firm* — Oblon, McClelland, Maier & Neustadt, L.L.P.

(57) ABSTRACT

A cooling system for a photovoltaic panel including micro flat heat pipes (HP) integrated with thermoelectric generators (TEG) and a cooled water reservoir for cooling the working fluid in heat pipes. The cooled water in the reservoir is pumped from the condensate pan of an air conditioner. Experimental results show that cooling system reduced the average temperature of the panel by as much as 19° C. or 25%. Further, the output power of the photovoltaic panel increased by 44% when the photovoltaic panel was used in a very hot climate (30-40° C.). An additional two watts of power was generated by the TEGs.

17 Claims, 26 Drawing Sheets

(51) Int. Cl.
*F24S 20/30* (2018.01)
*H01L 35/04* (2006.01)
*F24S 40/55* (2018.01)
*H02S 40/42* (2014.01)

(52) U.S. Cl.
CPC .......... *F28D 15/0233* (2013.01); *H01L 35/04* (2013.01); *H02S 40/42* (2014.12); *F24F 2005/0067* (2013.01); *F28D 2015/0225* (2013.01)

(58) Field of Classification Search
CPC .. F24F 1/42; F24F 13/222; F24F 13/22; F24F 5/0046; H01L 23/473; H01L 31/052; H01L 35/04; F28D 15/0233
See application file for complete search history.

(56) References Cited

U.S. PATENT DOCUMENTS

| | | | |
|---|---|---|---|
| 7,131,487 B2* | 11/2006 | Chang | F28D 15/02 361/689 |
| 9,995,507 B2 | 6/2018 | Norman et al. | |
| 10,116,254 B1* | 10/2018 | Bosley | H02S 30/20 |
| 2002/0029580 A1* | 3/2002 | Faqih | F24F 13/222 62/291 |
| 2002/0075938 A1* | 6/2002 | Mattoon | G01K 1/026 374/183 |
| 2007/0144574 A1* | 6/2007 | Yada | F28D 15/0233 136/246 |
| 2007/0279868 A1* | 12/2007 | Tanaka | G06F 1/203 361/702 |
| 2011/0155214 A1* | 6/2011 | Lam | H02S 40/42 136/246 |
| 2015/0000723 A1* | 1/2015 | Cheng | H02S 40/44 136/248 |
| 2015/0162473 A1* | 6/2015 | Chen | H01L 31/055 136/246 |
| 2016/0268967 A1* | 9/2016 | Webb | H02S 40/425 |
| 2018/0205343 A1* | 7/2018 | Perego | H02S 40/38 |

FOREIGN PATENT DOCUMENTS

| | | |
|---|---|---|
| CN | 101876516 A | 11/2010 |
| CN | 10-1546853 B1 | 8/2015 |
| CN | 107461954 A | 12/2017 |

OTHER PUBLICATIONS

Jason Svarc, "How Are Solar Panels Made?", Clean Energy Reviews, https://www.cleanenergyreviews.info/blog/solar-panel-components-construction, Aug. 20, 2018, pp. 1-10.

"ACOPOWER 15 Watt 12 Volt Polycrystalline Solar Panel", ACOPOWER 15 Watts Poly Solar Panel for 12 Volts Battery Charging—acopower.com, https://www.acopower.com/product/acopower-15w-12v-poly-off-grid-solar-panel, Aug. 8, 2019, 3 pages.

"Solar Module 170w", DMSOLAR Solar Panel 170W, www.dmsolar.com/170w-monocrystalline-solar-mod.html, Aug. 8, 2019, 1 page.

"Thermoelectric Generator/Seebeck generator-TEG Modules", Thermoelectric Generator—Everredtronics Ltd., www.everredtronics.com/thermoelectric.generator.html, Aug. 8, 2019, 2 pages.

"MHP-2550A300A", AMEC Thermasol, www.amecthermasol.co.uk, Aug. 8, 2019, 5 pages.

\* cited by examiner

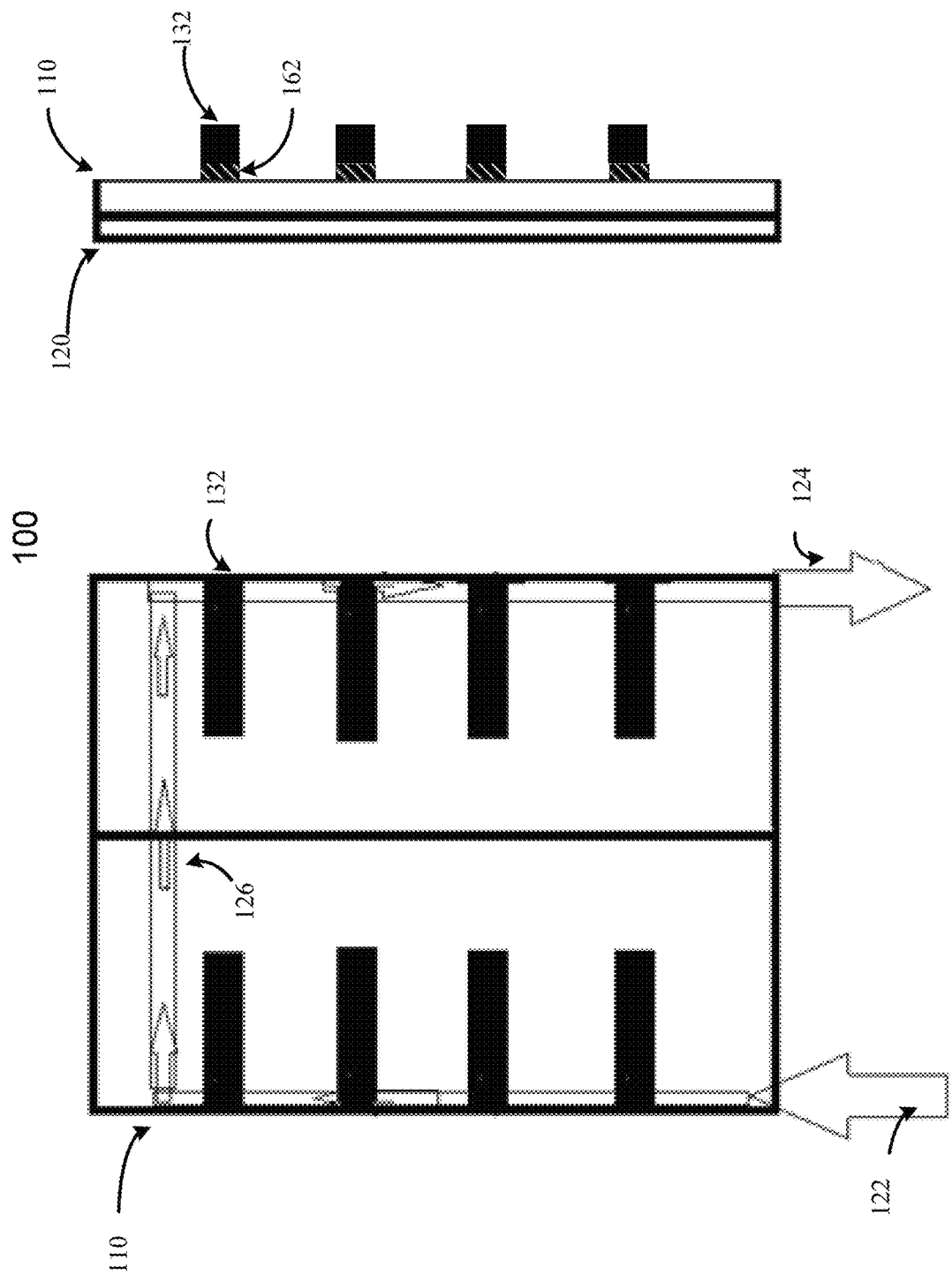

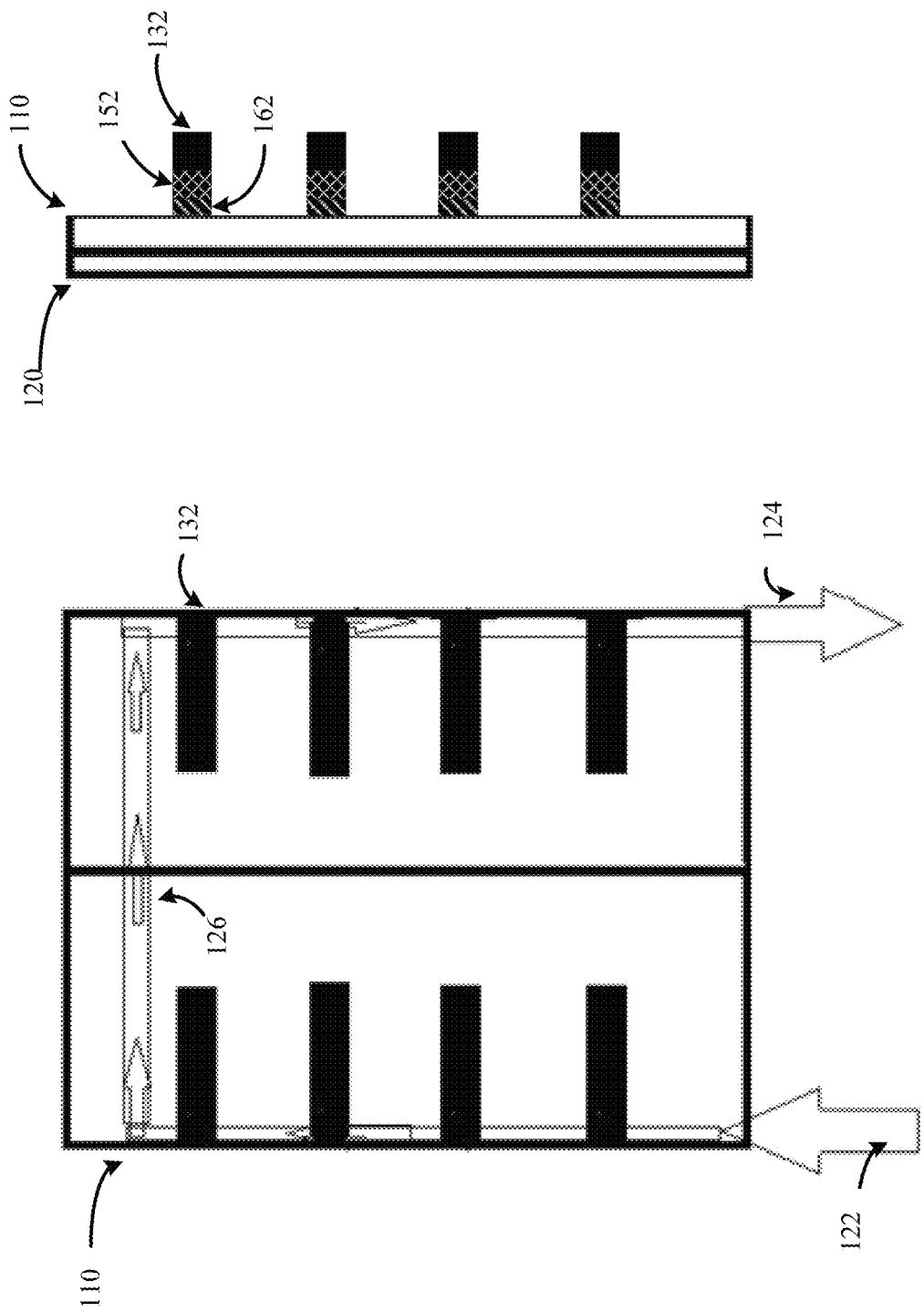

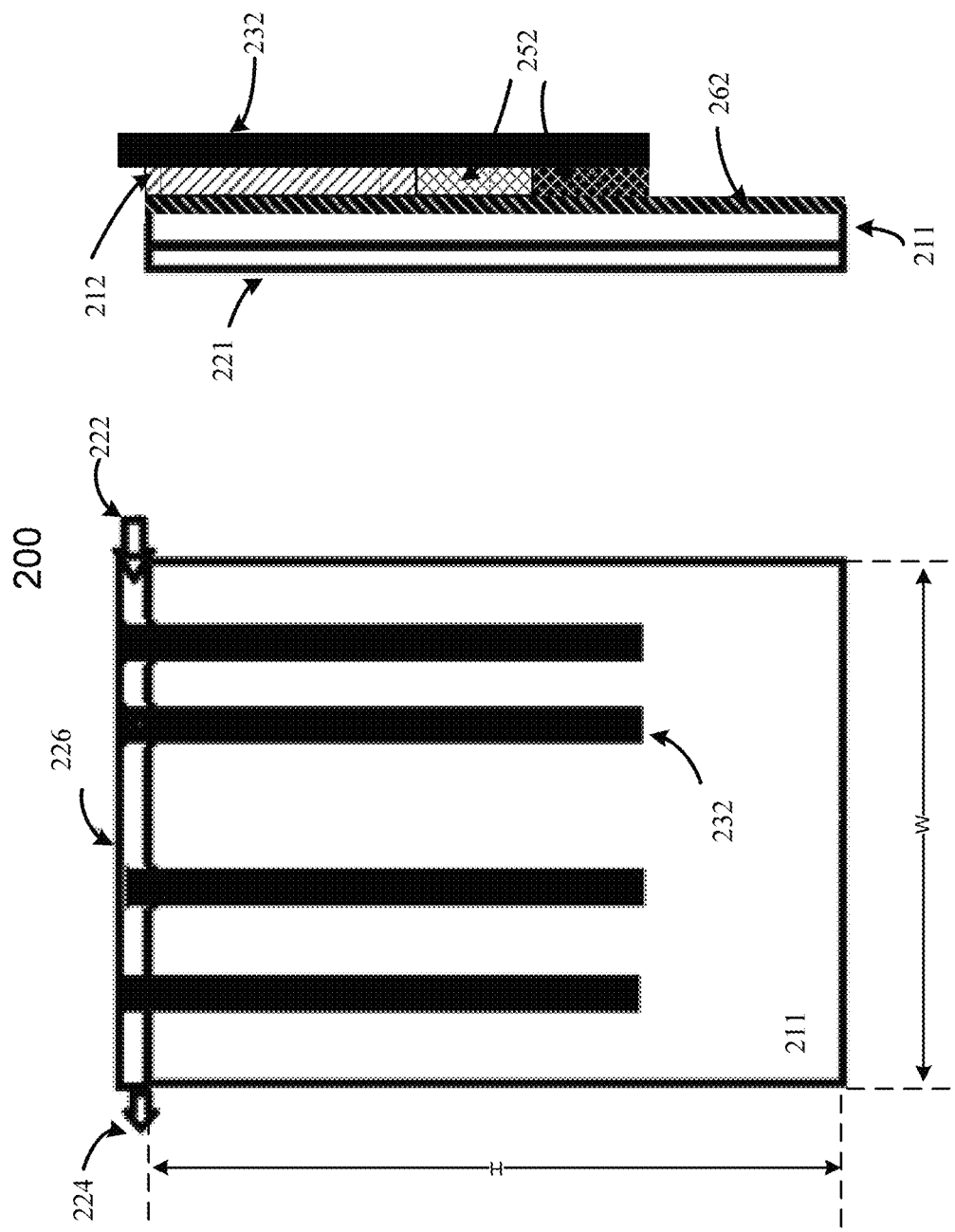

ENHANCED PERFORMANCE THERMOELECTRIC GENERATOR

CROSS-REFERENCE TO RELATED APPLICATIONS

The present application claims priority to Provisional Application No. 62/799,273 entitled "An Innovative Design of Enhanced-Performance Photovoltaic panel Using Heat Pipe and Thermoelectric Generator" filed on Jan. 31, 2019, the entire contents of which are incorporated herein by reference.

BACKGROUND

Technical Field

The present disclosure is directed to a photovoltaic panel cooling system comprising a plurality of heat pipes, a plurality of thermoelectric generators and a cooling path which includes water from air conditioning condensate.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Some countries have a high value of solar irradiance which can be utilized to generate electricity with photovoltaic panels. A technical problem with high irradiance is that it increases the operating temperature of the photovoltaic panel causing degradation in its efficiency. The efficiency of conventional commercial solar cells is in the range of 5-20% under normal operating conditions. A large portion of the radiation falling on the photovoltaic panel is converted into heat, which elevates the temperature of the solar cell and reduces efficiency. Thus, the temperature of the panel must be considered in the design of a solar installation.

Air-cooling and water-cooling methods have been commonly used for solar cell cooling, but cannot fully remove the excess heat in very high irradiance areas. Heat pipe cooling is a promising cooling technology due to its high heat transfer efficiency and uniform temperature distribution, and may aid or replace air and water cooling methods. The use of heat pipe technology in solar systems has been investigated in recent years. A flat heat pipe solar collector for a building envelope (called a "heat mat") was investigated with and without photovoltaics bonded to its surface. (See H. Jouharal, J. Milko, J. Danielewicz, M. A. Sayegh, M. Szulgowska-Zgrzywa, J. B. Ramos, S. P. Lester, "The performance of a novel flat heat pipe based thermal and PV/T solar collector that can be used as an energy-active building envelope material" Energy 108 (2016), 148-154, incorporated herein by reference in its entirety).

A finned heat pipe was investigated for reducing the operating temperature of a photovoltaic panel. A maximum decrease of 13.8 K was achieved by using the finned heat pipe. (See Sandeep Koundinya, VigneshkumarN, A. S Krishnan "Experimental Study and Comparison with the Computational Study on Cooling of PV Photovoltaic panel Using Finned Heat Pipe Technology" 5th International Conference of Materials Processing and Characterization (ICMPC 2016), Materials Today: Proceedings 4 (2017) 2693-2700, incorporated herein by reference in its entirety).

Six experimental configurations of solar thermal collectors using heat pipes showed that the conversion efficiency of solar to thermal energy for the integrated heat pipe solar collector with PV panels ranged from 35 to 52%. It was also found that the temperature of photovoltaic panel with and without heat pipes reached up to 35° C. and 60° C., respectively. (See H. Jouhara a, M. Szulgowska-Zgrzywa, M. A. Sayegh, J. Milko, J. Danielewicz, T. K. Nannou, S. P. Lester "The performance of a heat pipe based solar PV/T roof collector and its potential contribution in district heating applications", Energy 136 (2017) 117-125, incorporated herein by reference in its entirety).

Further details regarding heat pipes and their applications were presented by Mochizuki et al.; Faghri et al.; Chang et al.; El-Nasr et al.; Gamer; Chen et al.; Akbarzadeh et al.; Anderson et al.; and Zhao et al. (See Mochizuki M, Nguyen T, Mashiko K, Saito Y, Nguyen T, Wuttijumnong V. "A review of heat pipe application including new opportunities". Front Heat Pipe 2011; 2:013001; Faghri A. "Review and advances in heat pipe science and technology". J Heat Transf 2012; 134(12):123001; Chang Y W, Cheng C H, Wang J C, Chen S L. "Heat pipe for cooling of electronic equipment". Energy Conyers Manag 2008; 49(11):3398-404; El-Nasr A A, El-Haggar S M. "Effective thermal conductivity of heat pipes". Heat Mass Transf 1996; 32(1): 97-101; Garner S D. "Heat pipes for electronics cooling applications". Electron Cool 1996; 2(3); Chen X, Ye H, Fan X, Ren T, Zhang G. "A review of small heat pipes for electronics". Appl Therm Eng 2016; 96:1-17; A. Akbarzadeh and T. Wadowski, "Heat Pipe-Based Cooling Systems for Photovoltaic Cells under Concentrated solar Radiation," Applied Thermal Engineering, Vol. 116, No. 1, 1996, pp. 81-87; W. G. Anderson, P. M. Dussinger, D. B. Sarraf and S. Tamanna, "Heat Pipe Cooling of Concentrating Photovoltaic Cells," 33rd IEEE Photovoltaic Specialists Conference, San Diego, May 2008, pp. 1-6; and Y. H. Zhao, et al., "A Sort of Micro Heat Pipe Array and Processing Technics," Chinese Patent: 200810225649, each incorporated herein by reference in their entirety).

In areas having very hot climates, much of the energy consumed is due to air conditioning. During the operation of an air conditioner, when the temperature of the evaporator is less than the dewpoint temperature of the ambient air, water vapor that condenses in the evaporator is discarded, which wastes a source of energy. Water produced by air conditioners was studied. Over a 9-month period, it was found that the mean of produced water was 21.3-47.6 Liters/day. This condensate water was used to cool a condenser of a split-type air conditioner. (See Jun-jun Wu, Bin Lin, Yu Tan, Hua Li, Cheng-cheng Huang, Lei Cao, "Air-conditioning condenser integrated with a spray system utilizing condensate water"; Vali Alipour, Amir Hossein Mahvi and Leila Rezaei, "Quantitative and qualitative characteristics of condensate water of home air-conditioning system in Iran", Desalination and Water Treatment, 2015; 53 (7), both incorporated herein by reference in their entirety).

None of the above efforts utilized condensate from a connected air conditioning unit to cool photovoltaic panels.

Accordingly, in order to enhance the performance and efficiency of solar electricity generating systems, the present disclosure provides a system that includes the use of micro flat heat pipes to cool a photovoltaic panel by absorbing heat from a back plate. The heat recovered is utilized to generate extra electricity by using thermoelectric generators while the remaining heat is absorbed by cool water sourced from condenser evaporate of an air conditioner.

SUMMARY

In an exemplary embodiment, a cooling system for a photovoltaic panel comprises a photovoltaic panel having a front surface, a back surface, a frame and at least one electrical junction box, wherein the photovoltaic panel is configured to generate electrical current from solar radiation impinging on the front surface, a plurality of thermoelectric generators having a first side and a second side, the first side attached to the back surface, wherein each thermoelectric generator is configured to generate electrical current when the first side is at a different temperature than the back side, a plurality of micro flat heat pipes (HP), wherein each micro flat heat pipe is attached to the second side of at least one thermoelectric generator, each micro flat heat pipe having a hot end and a cold end. Further included are a plurality of heat sinks, each heat sink including a water reservoir, at least one air conditioner including an evaporator and a condensate drain, a water pumping unit including a fluid manifold in thermal contact with the hot ends of the plurality of micro flat heat pipes and a pump fluidly coupled connected to each water reservoir and the condensate drain, a battery, a controller operatively connected to the pump, the plurality of thermoelectric generators, the at least one electrical junction box and the battery, the controller including circuitry and at least one processor, the controller configured to receive electrical current from the at least one electrical junction box and the plurality of thermoelectric generators, control a speed of the pump, and invert the electrical current to charge the battery.

In another exemplary embodiment, a method for operating the cooling system for a photovoltaic panel of the first embodiment comprises receiving, by a controller including circuitry and at least one processor having program instructions, a current signal from the temperature sensor, comparing, by the processor, the current signal to a temperature threshold, if the temperature current signal is equal to or is below the temperature threshold, turning on the at least one junction box, if the temperature of the back surface is greater than the temperature threshold, turning on the pump, wherein turning on the pump causes condensate water to flow in the fluid manifold and remove heat from the hot ends of the heat pipes, continuing to receive and compare the temperature of the back surface to the temperature threshold until the temperature of the back surface signal is equal to or below the temperature threshold, then turning on the at least one junction box, and controlling the pump speed to keep the temperature of the back surface below the temperature threshold.

In another exemplary embodiment, a method for assembling a cooling system for a photovoltaic panel comprises connecting, by thermally conductive adhesive, a plurality of thermoelectric generators to a back surface of the photovoltaic panel; attaching, by thermally conductive adhesive, one of a plurality of micro flat heat pipes (HP) over at least one thermoelectric generator; attaching, by thermally conductive adhesive, an aluminum spacer to a back surface of the photovoltaic panel proximate each thermoelectric generator and beneath each micro flat heat pipe; attaching, by first piping, condensate water from an air conditioning evaporator to a pump, connecting, by second piping, the pump to a first heat sink reservoir, connecting, by third piping, the first heat sink reservoir to a second heat sink reservoir, connecting, by fourth piping, the second heat sink reservoir to a drain, connecting, by thermally conductive adhesive, the second piping over each first end of a first number of micro flat heat pipes, and connecting, by thermally conductive adhesive, the fourth piping over each first end of a second number of micro flat heat pipes, the first number and the second number equaling the plurality of micro flat heat pipes. The third embodiment further comprising attaching, by thermally conductive adhesive, electrode ends of a temperature sensor to the back surface.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein:

FIGS. 1A and 1B illustrate a panel design including heat pipes for: (A) a monocrystalline photovoltaic panel and (B) a side view showing flat heat pipes adhered to the photovoltaic panel;

FIGS. 1C and 1D illustrate a panel design including heat pipes and TEGs for: (A) a polycrystalline photovoltaic panel and (B) a side view showing flat heat pipes placed over thermoelectric generators which are adhered to the photovoltaic panel;

FIGS. 2A and 2B illustrate a panel design including heat pipes and TEGs for: (A) a polycrystalline photovoltaic panel and (B) two thermoelectric generators and a spacer between a flat heat pipe and the photovoltaic panel;

FIG. 15 illustrates the results from SAM software;

FIG. 16 illustrates the direct and indirect costs of the system using SAM software;

DETAILED DESCRIPTION

Figure 3A:
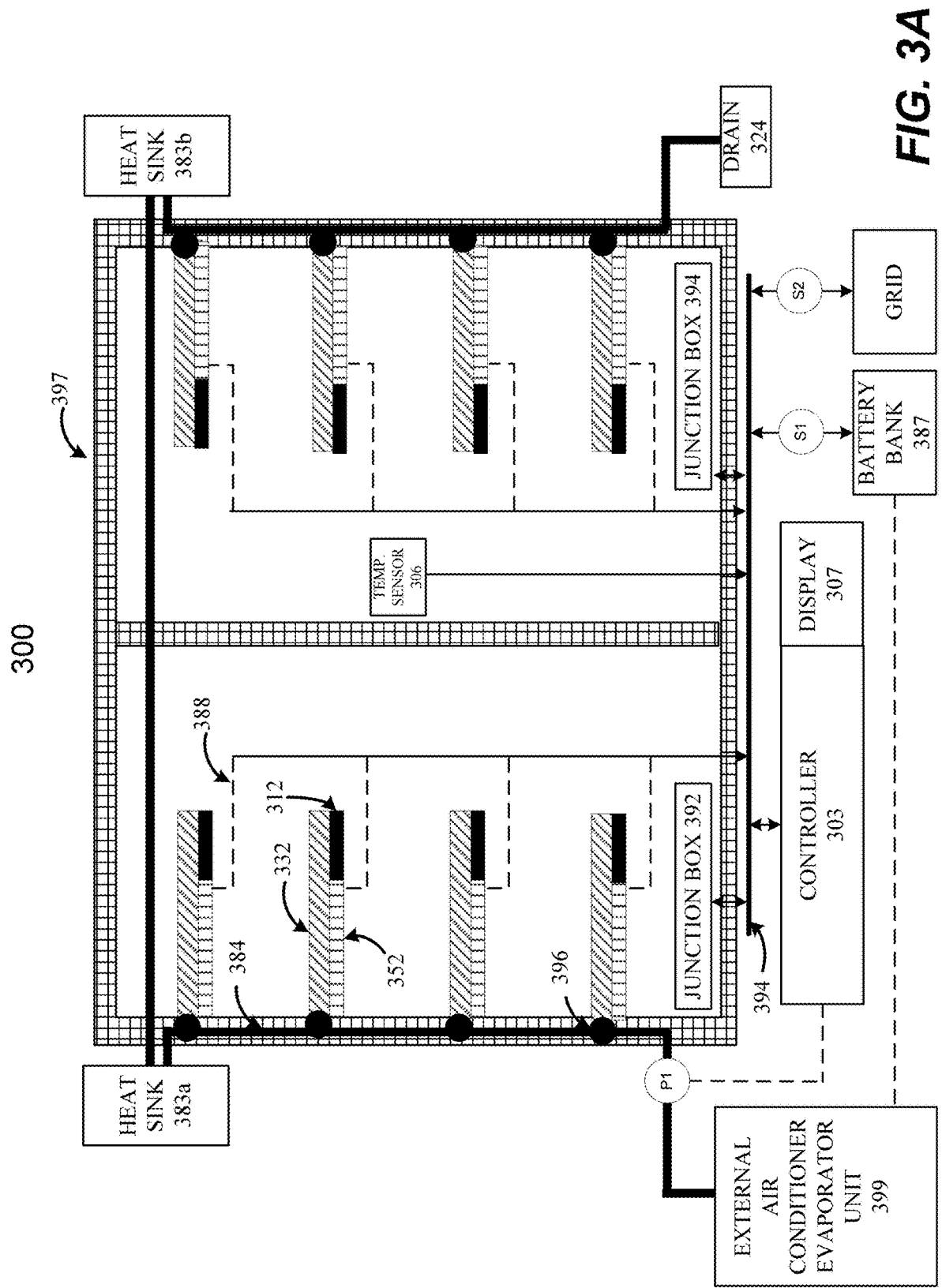
FIG. 3A illustrates a cooling system for a PV module.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "approximate," "about," and similar terms generally refer to ranges that include the identified value within a margin of 20%, 10%, or preferably 5%, and any values therebetween.

Aspects of this disclosure are directed to a system and method for cooling a photovoltaic panel using heat pipes, thermoelectric generators and cooled water sourced from condensate from an air conditioner evaporator unit.

Solar power is a source of energy which is expected to play a large role in satisfying future global demands for electricity. A major obstacle hindering useful photovoltaic (PV) utilization is the deterioration of the efficiency of a solar cell with temperature.

Elevations in temperature on the back side of photovoltaic panels cause a reduction in solar cell efficiency. Therefore, cooling arrangements are needed at this surface to reduce these losses. Further, long term, elevated temperatures of the solar cells in the photovoltaic panel may cause solar cell damage and reduce the cell's life time. Hence, it is very important to moderate the temperature of a photovoltaic panel in order to protect the solar cells.

The present disclosure describes aspects of the integration of a photovoltaic panel with heat pipes to remove heat from the rear surface of the panel. Additionally, thermoelectric generators are attached between the photovoltaic panel and the heat pipes to generate extra electricity and remove heat from the surface of the panel, e.g., to enhance the electricity generating performance and efficiency of the solar panel.

The present disclosure demonstrate that incorporating micro flat heat pipes onto a photovoltaic panel reduces the temperature of the panel and enhances its efficiency. It is further demonstrated that incorporating thermoelectric generators onto a photovoltaic panel produces extra output power (as found experimentally, and extra two watts were produced) and using (cold) condensed water from a connected air conditioner to cool micro flat heat pipes enhances the performance of the photovoltaic panel. Conventionally this condensed water is drained to the outdoors and discharged. Utilizing the condensed water as a source of cold water adds no extra cost to the system other than the initial cost of piping and a pump or transfer system.

In the present disclosure, an energy efficient and cost effective hybrid photovoltaic panel system is described which increases solar energy conversion efficiency. The hybrid system includes a photovoltaic panel, a plurality of micro flat heat pipes (HP) each integrated with one of a plurality of thermoelectric generators (TEG). The condensation section of each heat pipe is cooled using a condensate (e.g., water) from the evaporator unit of a connected air conditioner (which is usually at 5-7° C.).

In non-limiting examples shown in FIG. 1A-1D, 2A-2B, different types of photovoltaic panel systems were used to compare the cooling effect of the hybrid system. The first photovoltaic panel 100 cooling system, shown in FIG. 1A (back panel view 110) and in FIG. 1B (panel side view), was constructed of monocrystalline silicon solar cells and had a surface area of 1.114 m$^2$ and maximum power of 170 W at standard test conditions (i.e., without the TEG cooling system of the present disclosure). In FIG. 1A, 1B, the photovoltaic panel includes eight heat pipes 132 connected to the back panel 110 by thermal adhesive 162.

FIG. 1C, ID show the back side view and side view of a polycrystalline photovoltaic panel including both heat pipes 132 and thermoelectric generators 152. In FIG. 1C, 1D, there are eight heat pipes 132 and eight thermoelectric generators (TEG) 152. The TEGs are bonded to the photovoltaic panel by adhesive 162.

The third photovoltaic panel 200 cooling system was constructed of polycrystalline silicon solar cells and has a surface area of 0.105 m$^2$ and maximum power of 15 W at standard test conditions. The second (polycrystalline) photovoltaic panel cooling system 200 has a front, sun facing side 221 and a back side 211. The back side 211 was configured with four flat heat pipes 232 as shown in FIG. 2A, each heat pipe separated from the rear side by two TEGs 252 (shown as cross-hatched structures beneath 232) for a total of eight TEGs. An aluminum spacer 212 is placed between the back 211 of the photovoltaic panel and each heat pipe 232 to fill in the region which does not include a TEG. The aluminum spacer 212 distributes the heat from the back side 110 of the photovoltaic panel to the heat pipe. In a non-limiting example, the width, W, of the photovoltaic may be 30 cm and the height, H, may be 35 cm. The aluminum spacer and the TEGs are connected to the back side of the panel by thermal adhesive 262.

In a non-limiting example, the monocrystal line photovoltaic panel may be the DMSolar Photovoltaic panel 170w available from DMSolar, LLC, 12337 NW 53rd Street, Coral Springs, Fla., 33076, United States, and the polycrystalline photovoltaic panel 200 may be the ACOPower 15 Watt 12 Volt Polycrystalline Photovoltaic panel, available from ACOPower, 4120 Valley Blvd, Walnut Calif. 91789, United States.

Tables 1 and 2 show the specifications for the heat pipes and thermoelectric generators used in the non-limiting examples, respectively.

TABLE 1

| Heat Pipe Specifications | | |
|---|---|---|
| 1 | Packages Cooled | LED |
| 2 | Thermal Resistance | 0.2° C./W |
| 3 | External Height | 2.5 mm |

TABLE 1-continued

Heat Pipe Specifications

| 4 | External Width | 50 mm |
|---|---|---|
| 5 | External Length | 300 mm |
| 6 | Heat Sink Material | Aluminum |
| 7 | Working Fluid | Acetone |

TABLE 2

TEG Specifications

| 1 | Maximum Cooling Capacity | 128.7 W |
|---|---|---|
| 2 | Maximum Temperature Difference | +74K |
| 3 | Maximum Current | 13.1 A |
| 4 | Maximum Voltage | 15.7 V |
| 5 | Active Area | 55 mm$^2$ |
| 6 | Active Area Length | 55 mm |
| 7 | Active Area Thickness | 4.6 mm |
| 8 | Active Area Width | 55 mm |

Experiments were conducted on the non-limiting example configurations of FIG. 1A-2B to compare the performance of photovoltaic panels with and without the cooling system of the present disclosure. Comparisons made of:
1. The operating characteristics of the PV panels.
2. Maximum power operating point (MPP).
3. Thermal responses.
4. Power loss reductions due to panel temperature increases.

Figure 3B:
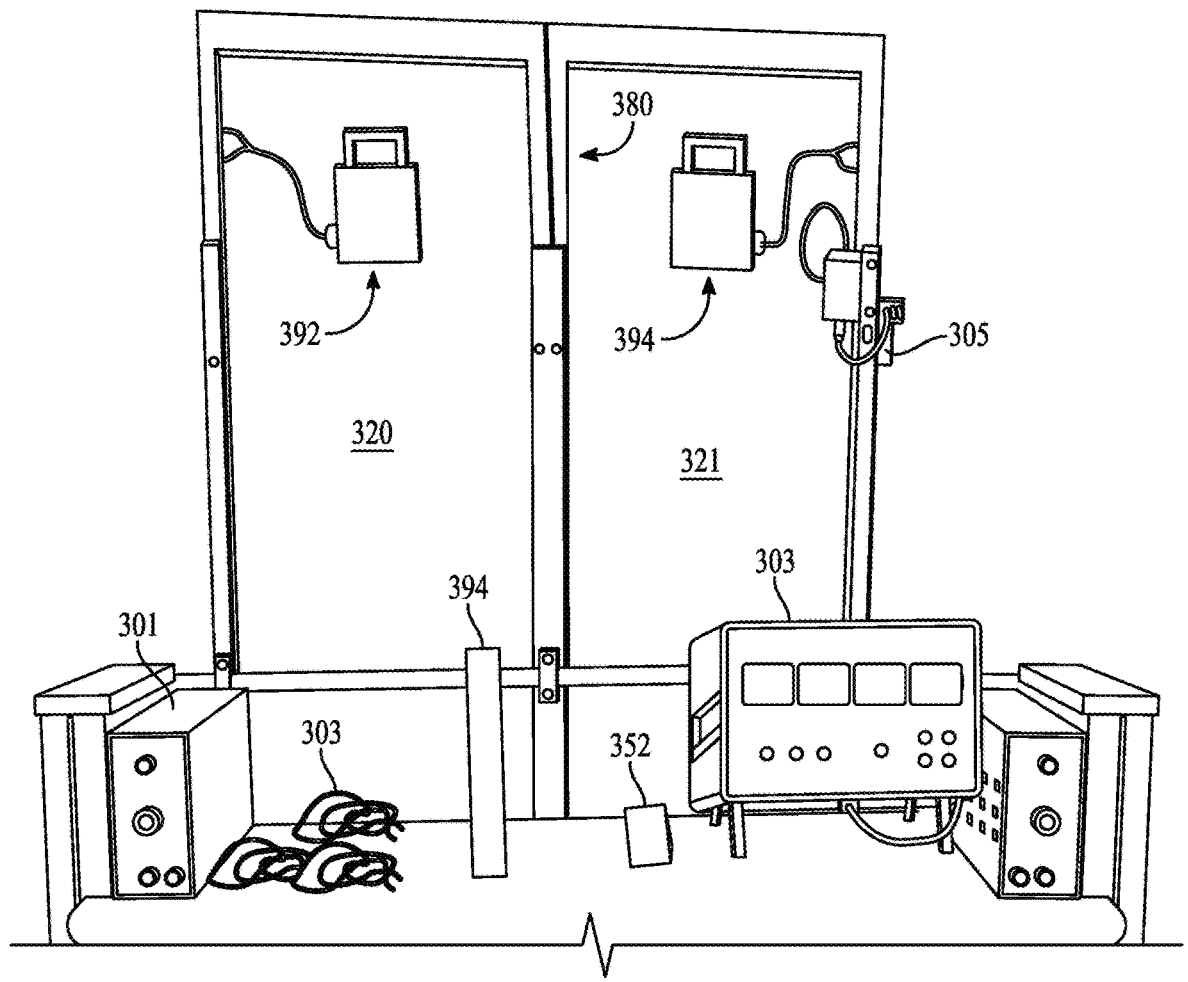
FIG. 3B illustrates an experimental setup for solar PV modules including measuring instruments.
Figure 3C:
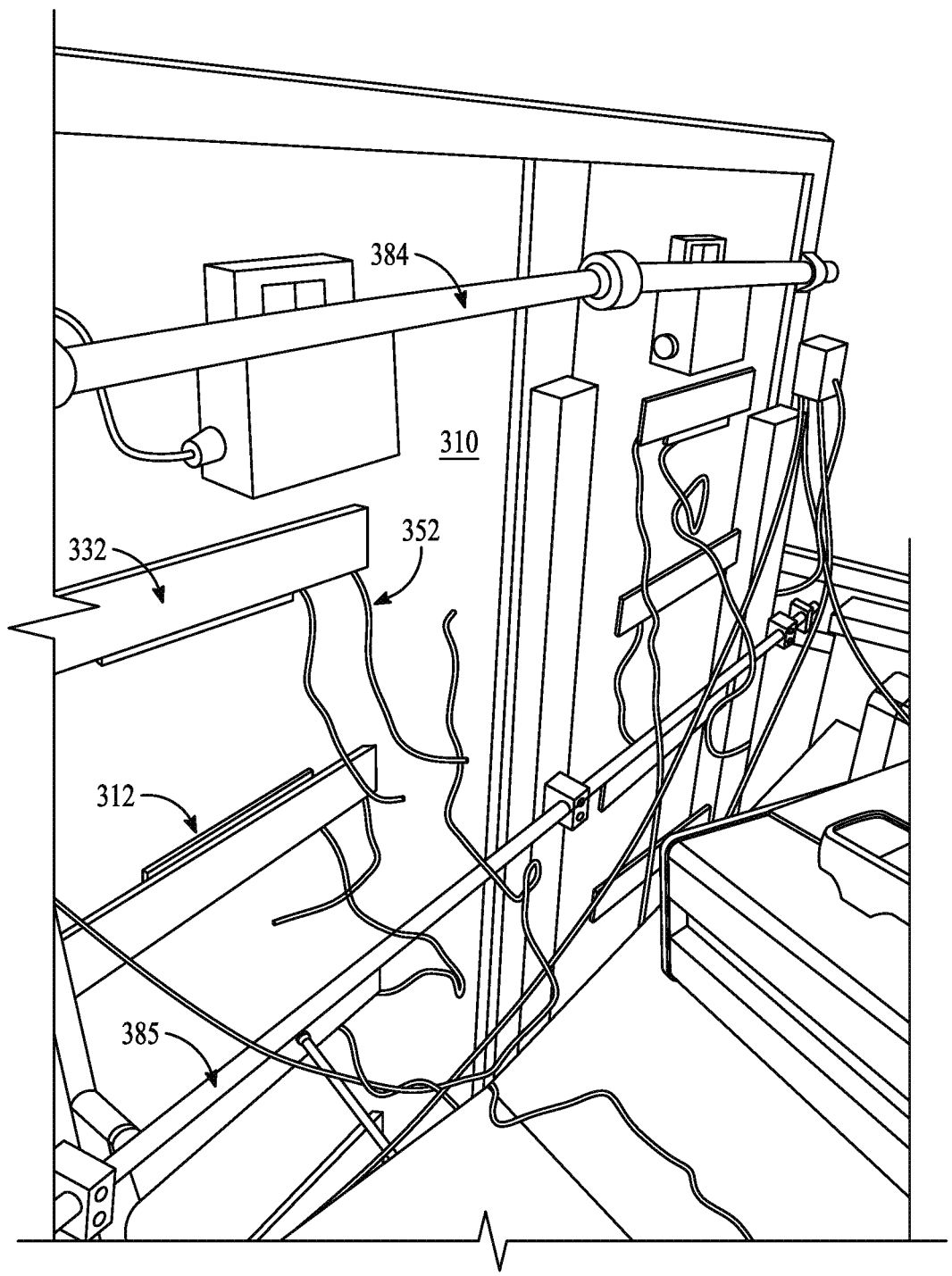
FIG. 3C illustrates an experimental setup for the solar PV modules including heat pipes and a water cooling system.
Figure 3D:
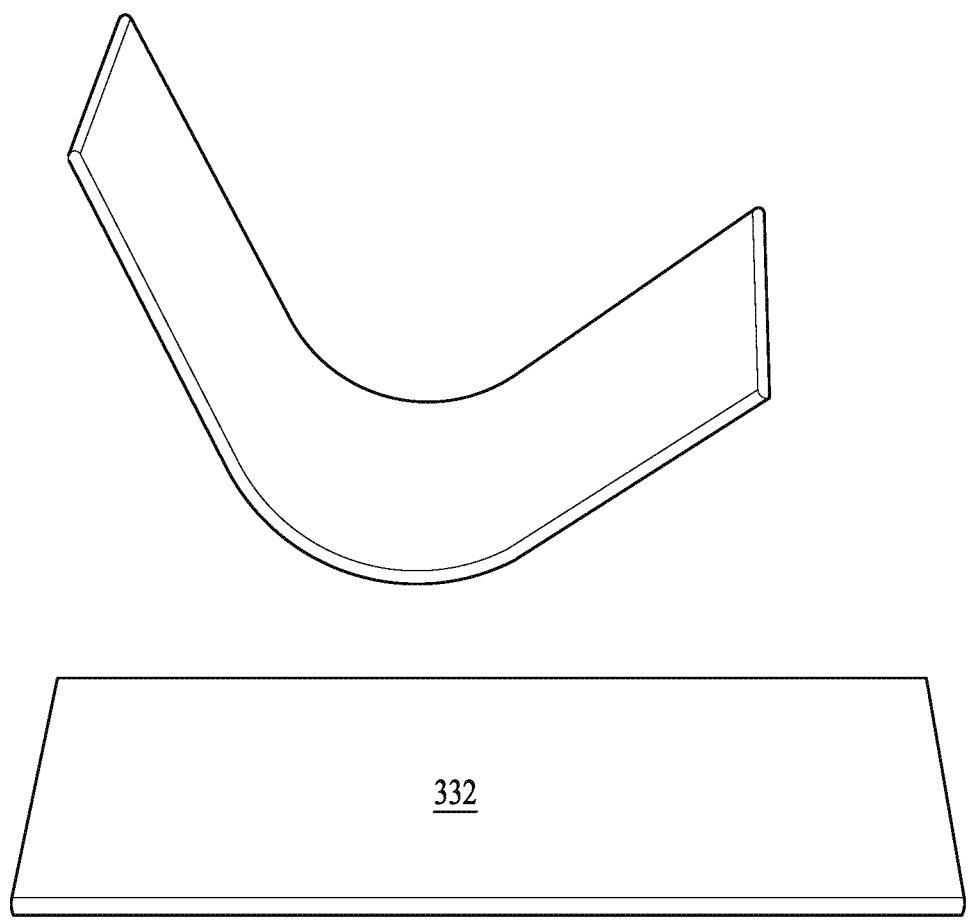
FIG. 3D illustrates the flexibility and structure of the micro flat heat pipes.
Figure 3E:
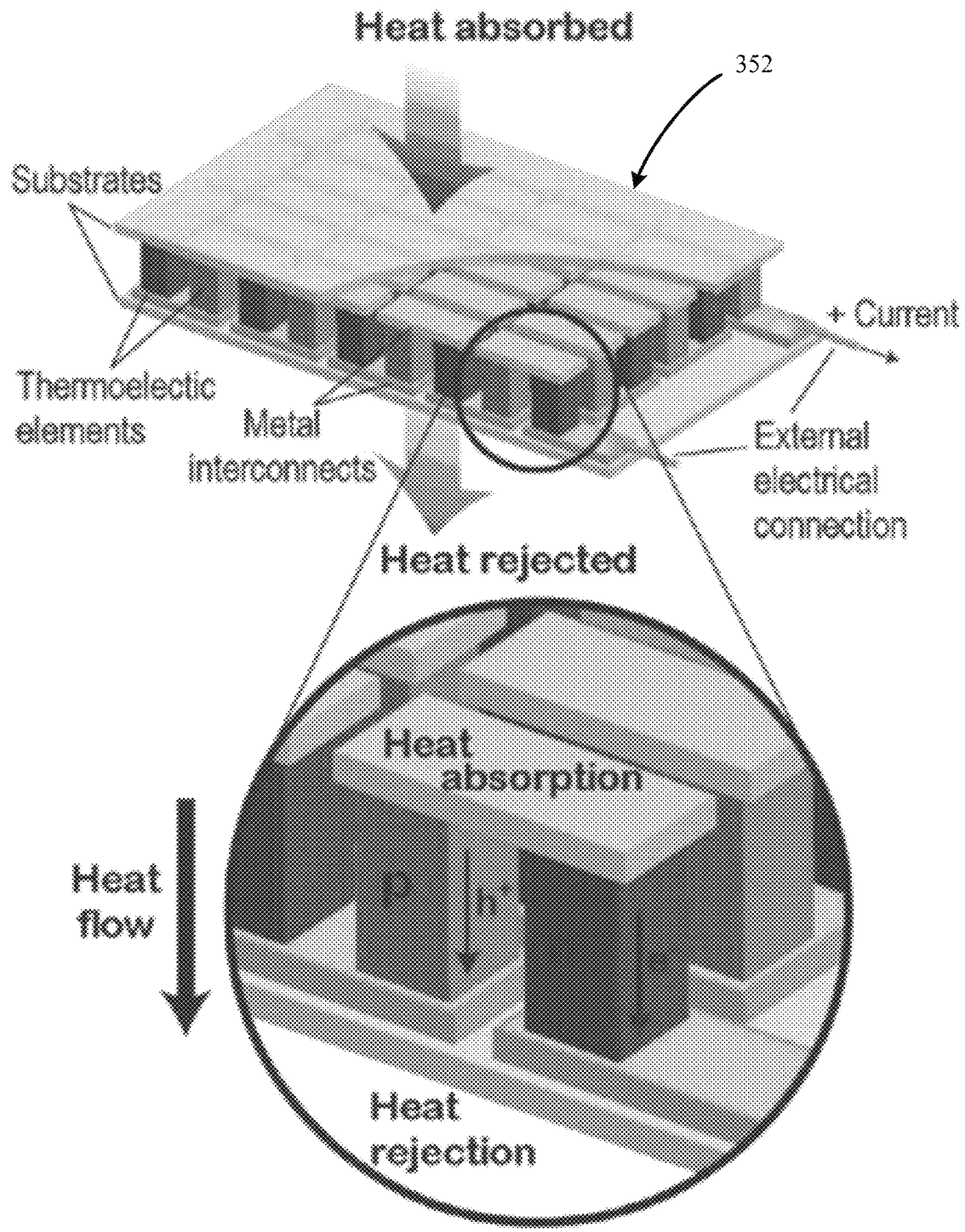
FIG. 3E illustrates a thermoelectric generator.
Figure 3F:
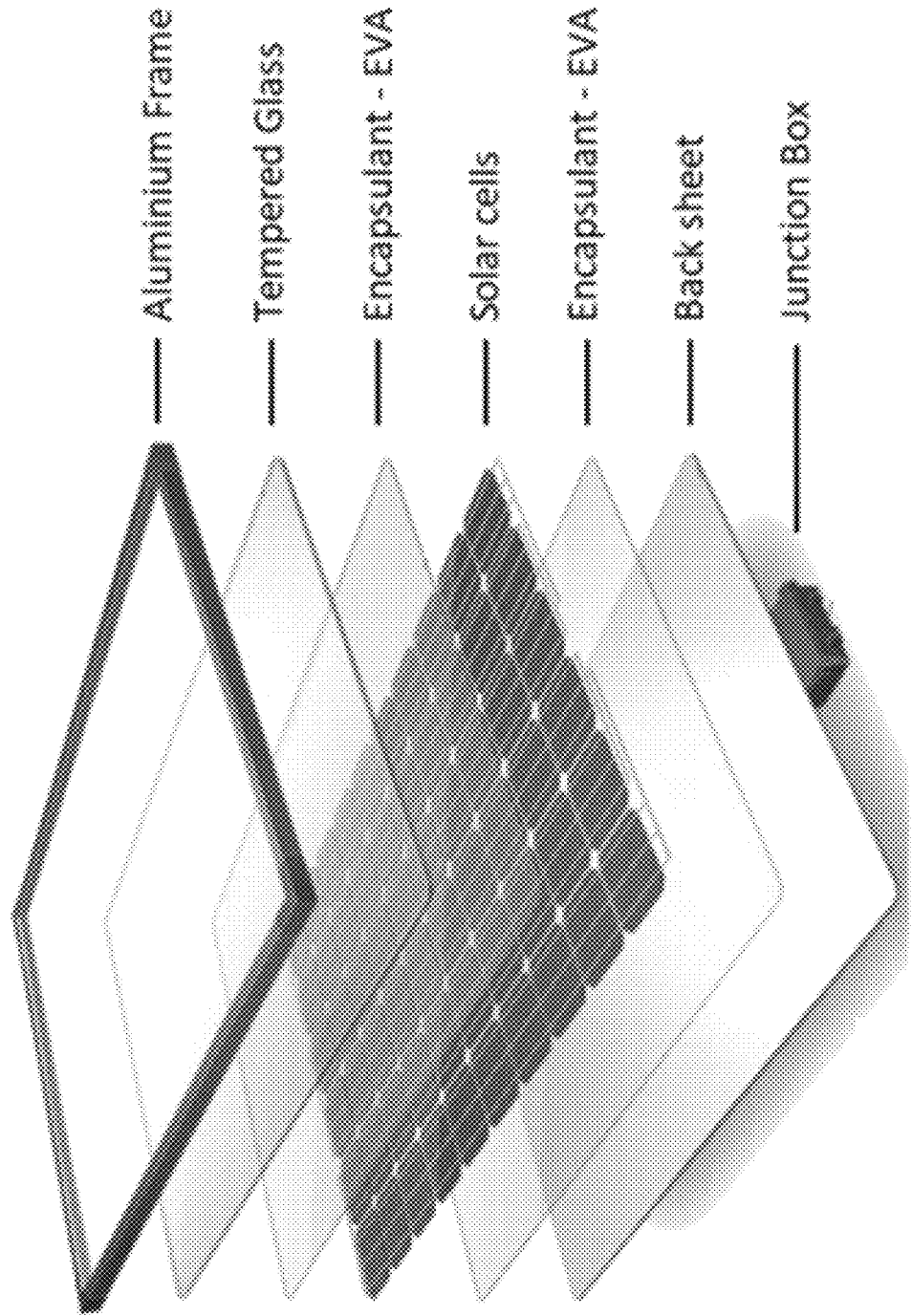
FIG. 3F illustrates the structure of a photovoltaic panel.

A conventional photovoltaic panel as shown in FIG. 3F, comprises a plurality of layers, a frame and a junction box. The frame is preferably composed of aluminum, which is lightweight and has high tensile strength to enhance snow load resistance and wind impact. The frame is even more preferably anodized aluminum. The frame holds a first, sun facing, a physical barrier layer of transparent material, which may be of transparent polymer or of tempered glass, a second encapsulant layer, usually EVA, a third layer of solar cells, a fourth encapsulant layer, a back sheet and the junction box is located on the rear side of the panel which is operatively connected to receive current generated by the solar cells. Most residential photovoltaic panels typically contain 60 mono or polycrystalline cells linked together via busbars in series to generate a voltage between 30-40 volts depending on the type of cell used. Larger photovoltaic panels used for commercial systems and utility scale solar farms contain 72 or 96 cells and in turn operate at a higher voltage. The electrical contacts which interconnect the cells are known as busbars and allow the current to flow through all the cells in a circuit. The backsheet material is made of various polymers or plastics including PP, PET and PVF which offer different levels of protection, thermal stability and long term UV resistance. (See Svarc, J., "How are Photovoltaic panels Made", Aug. 20, 2018, Clean Energy Reviews, https://www.cleanenergyreviews.info/blog/solar-panel-components-construction, incorporated herein by reference in its entirety). Alternatively, the photovoltaic panel may be a flexible panel, which is frameless and is constructed of polymer materials.

There are two main types of solar cell layers, either monocrystalline or polycrystalline silicon. Monocrystalline cells (mono) are cut from a single crystal ingot and are more efficient but more expensive to manufacture. Polycrystalline cells, also known as multicrystalline cells, are grown from multifaceted crystalline material (grown in multiple directions) which is cheaper to produce but offers slightly lower efficiency. Mono cells also offer slightly improved performance with a better temperature coefficient and a slightly lower rate of light induced degradation (LID) over time. Monocrystalline cells have a slightly lower cell temperature coefficient which results in higher performance in elevated temperature. The power temperature coefficient is the amount of power loss as cell temperature increases. All solar cells and panels are rated using standard test conditions (STC—measured at 25° C.) and slowly reduce power output as cell temperature increases. Generally cell temperature is around 25-30° C. higher than the ambient air temperature which equates to 10-12% lower efficiency. Solar panel efficiency (expressed as a percentage) quantifies a solar panel's ability to convert sunlight into electricity. Given the same amount of sunlight shining for the same duration of time on two solar panels with different efficiency ratings, the more efficient panel will produce more electricity than the less efficient panel. In practical terms, for two solar panels of the same physical size, if one has a 21% efficiency rating and the other has a 14% efficiency rating, the 21% efficient panel will produce 50% more kilowatt hours (kWh) of electricity under the same conditions as the 14% efficient panel. For the purpose of the present disclosure, the efficiency of a photovoltaic panel is calculated as the number of kilowatt hours of electricity produced when the panel is operated at an ambient temperature of 23 degrees Celsius as compared to the number of kilowatt hours produced when the photovoltaic panel is operated at higher temperatures The methods of the present disclosure are directed to increasing the efficiency, or kilowatt hour output, when the photovoltaic panel is operated under very intense sunlight conditions, by cooling the panel. Monocrystalline cells have lower losses due to an average temperature co-efficient (or loss) of around −0.38% per ° C. while polycrystalline cells are slightly higher at −0.41% per ° C. (See Svarc, J., "Top 10 Photovoltaic panels—Latest Technology 2019", Apr. 12, 2019, Clean Energy Reviews, https://www.cleanenergyreviews.info/blog/2017/9/11/best-solar-panels-top-modules-review, incorporated herein by reference in its entirety).

Two experimental apparatuses were built to test the operating conditions of each of the two different types of photovoltaic panel (polycrystalline and monocrystalline). The monocrystalline photovoltaic panel has a size of 1.114 m$^2$ while the polyhrystalline photovoltaic panel is 0.105 m$^2$. An artificial light source was used to simulate sunlight conditions for indoor experimentation. The light source was generated by eight halogen spotlights arranged in two rows. The inclination angle of each halogen spotlight was adjusted for each respective experiment to provide equal amounts of incident light on the photovoltaic panel.

FIG. 3A is an overview of a photovoltaic cooling system of the present disclosure as applied to a monocrystalline photovoltaic panel. A plurality of thermoelectric generators 352 are placed directly on the back sheet of the photovoltaic panel and a heat pipe 332 is placed over each TEG. Any space not occupied beneath the heat pipe by a TEG is filled in with an aluminum spacer 312 to conduct the heat from the backsheet to the heat pipe. The spacer may be a metallic spacer such as aluminum spacer or copper, or a spacer made from a thermally conductive polymer such as PA (polyamide), PBT (polybutylene terephthalate), PP (polypropylene), PPS (polyphenylene sulfide), and PEEK (polyether ether ketone) adjusted for heat conduction using specific fillers, such as graphite, carbon or ceramics. The filler also lends the material electrically isolating or electrically conductive properties.

The heat pipes 332 have their hot end contacting at 396 to the manifold 384 which conducts the cold water through pipes to the heat sinks. The heat pipes release their heat in the heat sinks 383. The water is expelled through drain 324. The heat pipes may be connected to the manifold by thermally conductive adhesive.

A controller includes a processor, display, memory, and I/O ports for accessing information from a keyboard, a mouse or other input peripherals as will be described in more detail with respect to FIG. 17. A display 307 provides feedback to a user to allow user input in controlling the cooling system.

The controller is connected to the modules of the cooling system by bus 394.

The controller is connected to the pump, P1. The controller is further connected to the temperature sensor 306 to receive temperature readings. The temperature readings are used to adjust the pump speed to change the water pressure.

The controller is connected to the junction boxes 392 and 394 to receive current generated by the solar cells of the photovoltaic panel. Additionally, the controller is connected by cables 388, only one of which is labelled, to each TEG. Although only the monocrystalline panel is shown in FIG. 3A, a similar configuration would be used to connect the circuitry and wiring for use with a polycrystalline photovoltaic panel. For the polycrystalline photovoltaic panel, two TEGs are used, as shown in FIG. 2B, for each heat pipe. The wiring in the embodiment shown in FIG. 2B includes connections to each TEG. The current from the junction boxes and TEGs may be stored in a battery bank 387, be provided to the grid, used to operate the air conditioner, or used to power other loads as needed. The controller can actuate switch S1 to charge the battery. The battery voltage can be used to power DC loads or converted to power AC loads. The battery bank voltage may range from 12-16 V, depending on the number of batteries switched in to the bank. The controller can actuate switch S2 to provide the power directly to an electrical grid.

The controller is operatively connected to at least one processor to perform calculations and comparisons of the temperature, current from the junction boxes, current received from the thermoelectric generators and the use the calculations to control the photovoltaic panel, the pumps, switch current received to charge the battery, provide power to operate the air conditioner, provide the current received from the thermoelectric generators, the junction boxes, the battery or the grid to power the controller, the air conditioner or loads.

The current signal received from temperature is compared to a current threshold. The current threshold may be less than or equal to 75° C., preferably less than or equal to 70° C., even more preferably less than or equal to 65° C.

The battery state of charge may be compared to a battery charge threshold. The battery charge threshold may be less than or equal to 16 V, preferably less than or equal to 15 V, even more preferably less than or equal to 14 V, and most preferably 12 V. The battery may be a lead acid battery, a lithium ion battery or a saltwater battery. In the present disclosure, the battery is preferably a lithium ion battery, which is lighter than lead acid batteries and has a longer lifespan. In a non-limiting example, the battery may be a ReLion Deep Cycle Lithium Battery, RB5 5Ah, available from RELion, 1433 Dave Lyle Blvd., Rock Hill, S.C. 29730.

FIG. 3B-3D describe the experimental setups and the measuring instruments.

Two conventional photovoltaic panels were employed for testing. Two monocrystalline panels are shown in FIG. 3B. The central frames 380 are connected together.

Sensors were connected to the (aluminum) frame and used to record illuminance, panel temperature, voltage and current by measuring instruments. The measuring instruments include a slide resistor 301, cables to connect the sensors with the measuring unit 303 and an illuminance sensor 305 (to ensure each panel receives the same amount of illuminance), each located as shown in FIG. 3B. The slide resistor is used with series resistors (not shown) to record TV characteristic curves. The junction boxes (392, 394) for each panel are attached to the upper part of the frame.

Illuminance sensor 305 is used to continuously measure the illuminance currently falling on the panel. The illuminance sensor includes a small reference solar cell with a known sensitivity which generates a photocurrent. Illuminance is the total luminous flux incident on a surface, per unit area. It is a measure of how much the incident light illuminates the surface, wavelength-weighted by the luminosity function to correlate with human brightness perception. Irradiance is the radiant flux (power) received by a surface per unit area. The SI unit of irradiance is the watt per square meter ($W/m^2$). The generated photocurrent is converted into a voltage signal and is displayed on the measuring unit. The measured illuminance is displayed on the measuring unit 3 as an irradiance measurement in $kW/m^2$.

d) Temperature sensor 306 is located on the backside 310 of the photovoltaic panel as shown in FIG. 3C. The temperature sensor 306 is attached in thermal contact with the back sheet material. This temperature sensor is used to measure the heating of the photovoltaic panel during operation. The temperature-dependent change in the resistance of the temperature sensor is indicated as a change in voltage at the measuring unit 303 and is displayed on the display element 307 as a temperature value. A 5-pin measuring cable is used to connect the temperature sensor 306 with the measuring unit 303.

Slide resistor 301 is used as a variable resistive load in the circuit with the solar modules. Resistance values from 0 ohms to 10 ohms can be set. If higher resistances are required for recording the Current-voltage curves, additional load resistors can be connected in series.

Measuring unit 303 as shown in FIG. 3B allows measurements of current, voltage, illuminance and temperature. The measurements required for the intended photovoltaic experiments can be observed using the display element 307 of the measuring unit 303.

A heat pipe is a heat-transfer device that combines the principles of both thermal conductivity and phase transition to effectively transfer heat between two solid interfaces. The heat pipe is a sealed copper tube that is under vacuum, and can transfer heat rapidly away from the source. Heat pipes employ evaporative cooling to transfer thermal energy from one point to another by the evaporation and condensation of a working fluid or coolant. Heat pipes rely on a temperature difference between the ends of the pipe. When one end of the heat pipe is heated, the working fluid inside the pipe at that end evaporates and increases the vapor pressure inside the cavity of the heat pipe. The latent heat of evaporation absorbed by the vaporization of the working fluid reduces the temperature at the hot end of the pipe. The vapor then travels along the heat pipe to the cold interface and condenses back into a liquid, releasing the latent heat.

The high thermal conductivity enables a heat pipe to transfer and dissipate heat to a more convenient location through a capillary action. The pipes can be flat or round, and can be formed to fit most contours. A heat pipe is constructed using a metal tube that is sealed under a partial vacuum. A heat pipe is a vacuum tight device filled with the liquid working fluid and is divided mainly into 2 sections, an evaporator section and a condenser section. Inside the copper heat pipe is an inner wick lining that acts as a capillary material for a small amount of fluid. As heat is applied to the heat pipe surface in the evaporator region, the fluid is heated and as it is under a vacuum it is easier to change it into a vapor. This phase change from a fluid to vapor creates pressure. Heat is then released as the vapor condenses back into a fluid. The fluid will then flow back into the warm region, where the cycle will repeat while heat is applied to that section. The first section is called evaporator section and it is bought in thermal contact with a hot point to be cooled. The second section, is called the condenser section and it is connected to the cold point where the heat can be dissipated. There is a section between the evaporator section and the condenser section, and is called adiabatic section. The liquid working fluid is vaporized in the evaporator section by the input heat, converted to vapor and then moves toward the cooler condenser section via the adiabatic section. In the condenser section, the vapor condenses and gives up its latent heat. Then the condensed liquid returns to the evaporator. As long as the temperature gradients between the evaporator and condenser are maintained, the two-phase flow circulation and the phase change processes are continued. The working fluid and its pressure should be chosen in such a way that its saturation temperature is between the evaporator temperature and the condenser temperature In a non-limiting example, the heat pipes 332, shown in FIG. 3D, used may be the MHP-2550A-300A, which is an ultra-flat heat pipe which eliminates the need of a fan and heat sink, with the additional benefits of reducing power consumption, noise output and product thickness. It can directly remove heat from the source and the heat can be transferred direct to the chassis or to an external heat sink. It also negates the requirement for ventilation holes and thereby reduces ingress of dust (no air filters required) and static. This heat pipe is capable of achieving up to 270 W of heat transfer and is available from Amecthermasol, 1-2 Steam Mill Lane, Great Yarmouth, Norfolk, NR31 0HP, U.K.

The working fluid used in the heat pipe in the non-limiting example was acetone, however the working fluid may be any one of the group comprising ammonia, water, ethanol and acetone.

A thermoelectric generator 352, as shown in FIG. 3E, is a solid state device that converts heat flux (temperature differences) directly into electrical energy through a phenomenon called the Seebeck effect (a form of thermoelectric effect). A thermoelectric module is a circuit containing thermoelectric materials which generates electricity from heat directly. A thermoelectric module consists of two dissimilar thermoelectric materials joined at their ends: an n-type (negatively charged), and a p-type (positively charged) semiconductor. A direct electric current will flow in the circuit when there is a temperature difference between the ends of the materials. Generally, the current magnitude is directly proportional to the temperature difference: $J=\sigma S \nabla T$, where $\sigma$ is the local conductivity, S is the Seebeck coefficient (also known as thermopower), a property of the local material, $\nabla T$ is the temperature gradient. The thermoelectric generator generates power by taking in heat from a high temperature source such as the back side of a photovoltaic panel. The cold side must be cooled by air or water or by contact with a heat pipe, as in the present disclosure. Heat exchangers are used on both sides of the thermoelectric generator module to supply this heating and cooling. The typical efficiency of TEGs is around 5-8%.

In a non-limiting example, the thermoelectric generator (252, 352) may be the TEG490-1402, MFR Part No. ET-127-30-15-RS, Peltier module manufactured by RS Components & Controls (I) Ltd., 1701/1, 7th Floor, Tower No-I, Express Trade Tower—II, Sector-132, Noida—201301, U.P., India.

A thermally conductive adhesive (162, FIG. 1A) was used to connect the thermoelectric generators and heat pipes to the photovoltaic panels.

In a non-limiting example, T-flex is used as the adhesive as it is an exceptionally soft and highly conductive gap filling material, making good thermal contact between the heat pipe, photovoltaic panel and TEG resulting in higher efficiencies.

The experimental apparatus for the monocrystalline photovoltaic panel 310 is shown in FIG. 3C, showing the back side. Eight thermoelectric generators 352 (denoted by wiring to the TEG 352 hidden beneath the heat pipe denoted 332) were adhered directly to the polymer back sheets of the photovoltaic panels and eight heat pipes 332 were adhered to and over the thermoelectric generators. A spacer (see 212, FIG. 2B) may fill the remaining space beneath the heat pipe. The spacer is one of an aluminum spacer, a thermally conductive polymer spacer and a copper spacer. The spacer is preferably aluminum, as it has the highest thermal conductivity and is light. The panels are held together and the heat pipe water system is supported by flexible support 385.

The manifold is connected at either end to heat sinks 383 which are immersed in a cooling water reservoir. The cooled water pumped in at P1 is from a chiller for the experiment and corresponds with an evaporate of an air conditioner evaporation unit 399.

Each heat pipe 332 has a hot end and a cold end. The hot end is in thermal contact 396 with the manifold 384, which extends around the outer perimeter of the panel. As shown in FIGS. 1A, 2A, and 3A, water enters the manifold 126/226/384 at port 122/222 and exits at drain 124/224/324.

The thermoelectric generators 352 and junction boxes of the panel 392, 394 are electrically connected to the measuring system (controller 303) to measure the power output.

The first embodiment is illustrated with respect to FIG. 1A to 3E. The first embodiment describes a cooling system 300 for a photovoltaic panel, comprising a photovoltaic panel having a front surface (120 or 221), a back surface (110 or 211), a frame 397 and at least one electrical junction box (392 or 394), wherein the photovoltaic panel is configured to generate electrical current from solar radiation impinging on the front surface, a plurality of thermoelectric generators 352 having a first side and a second side, the first side attached to the back surface, wherein each thermoelectric generator is configured to generate electrical current when the first side is at a different temperature than the back side, a plurality of micro flat heat pipes 332 (HP), wherein each micro flat heat pipe is attached to the second side of at least one thermoelectric generator, each micro flat heat pipe having a hot end (see, for example, the heat pipe labelled 332 and the end connected to the fluid manifold 384) and a cold end opposite the hot end, a plurality of heat sinks 383a, 383b, each heat sink including a water reservoir (not shown), at least one air conditioner 399 including an evaporator and a condensate drain, a water pumping unit including a fluid manifold 384 in thermal contact with the hot ends of the plurality of micro flat heat pipes and a pump P1 fluidly coupled connected to the heat sink water reservoir and the condensate drain, a battery 387, a controller 303 operatively connected to the pump, the plurality of thermoelectric generators, the at least one electrical junction box and the battery, the controller including circuitry and at least one processor, the controller configured to receive electrical current from the at least one electrical junction box and the plurality of thermoelectric generators, control a speed of the pump, and invert the electrical current to charge the battery.

The first embodiment includes a temperature sensor 306 having electrodes connected to the back surface and the controller, wherein the temperature sensor is configured to generate a current representative of the temperature of the back surface, and wherein the controller is further configured to control the pump based on the current from the temperature sensor.

The photovoltaic panel may be a monocrystalline photovoltaic panel (see FIG. 1A, B), wherein the plurality of micro flat heat pipes is eight and the plurality of thermoelectric generators is eight. However, the cooling system is not limited to eight micro flat heat pipes and eight thermoelectric generators. The cooling system may have a plurality of micro flat heat pipes and an equivalent plurality of thermoelectric generators which cover the framed area of the monocrystalline photovoltaic panel.

The photovoltaic panel may be a polycrystalline photovoltaic panel (see FIG. 2A, B), wherein the plurality of micro flat heat pipes is four and the plurality of thermoelectric generators is eight. In this alternative, each micro flat heat pipe is attached to the back sides of two thermoelectric generators.

The controller is further configured to determine a state of charge of the battery, and includes switching circuitry configured to switch the battery to one of receiving charging current and providing voltage to the air conditioner.

The controller is further configured to determine a state of charge of the battery, and further includes switching circuitry configured to switch the battery to one of receiving charging current and providing voltage to a load.

The controller further includes switching circuitry configured to connect the electrical current directly to an electrical grid.

A display 307 is operatively connected to the controller, and is configured to show the temperature of the back surface, a speed of the pump, the current output from each junction box, the battery state of charge and an operational status of the air conditioner.

For good heat transfer from the back surface to the micro flat heat pipe, a spacer 212 is placed between each heat pipe and the back surface, the spacer configured to provide thermal contact between the heat pipe and the back surface in areas not covered by the thermoelectric generator.

The second embodiment is illustrated with respect to FIG. 1A to 3E, FIG. 17 to FIG. 20. The second embodiment describes a method for operating the cooling system for a photovoltaic panel of the first embodiment and comprises receiving, by a controller (303, 1700) including circuitry and at least one processor (CPU 1701, 1703) having program instructions, a current signal from the temperature sensor 306, comparing, by the at least one processor, the current signal to a temperature threshold, if the temperature current signal is equal to or is below the temperature threshold, turning on the at least one junction box 392, 394. If the current signal is greater than the temperature threshold, turning on the pump, thus providing low temperature condensate water from the external air conditioner evaporator unit 399 to flow over the hot ends of the micro flat heat pipes and remove heat. The processor continuing to receive and compare the current signal from the temperature sensor to the temperature threshold until the current signal is equal to or below the temperature threshold, then, with the controller, turning on the at least one junction box, and controlling the pump speed to keep the current signal below the temperature threshold.

The method includes powering the controller by using current from at least one of the battery 387, at least one junction box (392 or 394), and the grid.

The method further includes determining, by the controller, the state of charge of the battery, comparing the state of charge of the battery to a battery charge threshold, and switching the electrical current to charge the battery when the state of charge is less than the battery charge threshold.

The method further includes wherein the temperature threshold is less than or equal to 75° C., preferably less than or equal to 70° C., even more preferably less than or equal to 65° C., and the battery charge threshold is less than or equal to 16 V, preferably less than or equal to 15 V, even more preferably less than or equal to 14 V and most preferably 12 V.

The third embodiment is illustrated with respect to FIG. 1A to 3E. The third embodiment describes a method for assembling a cooling system for a photovoltaic panel, comprising attaching, by a thermally conductive adhesive (162, FIG. 2B), a plurality of thermoelectric generators 152 to a back surface of the photovoltaic panel; attaching, by the thermally conductive adhesive, one of a plurality of micro flat heat pipes 132 (HP) over at least one thermoelectric generator; attaching, by the thermally conductive adhesive, an aluminum spacer 212 to a back surface of the photovoltaic panel proximate each thermoelectric generator and beneath each micro flat heat pipe; connecting, by first piping, condensate water from an air conditioning evaporator 399 to a pump P1, connecting, by second piping, the pump to a first heat sink reservoir 383a, connecting, by third piping, the first heat sink reservoir to a second heat sink reservoir 383b, connecting, by fourth piping, the second heat sink reservoir to a drain 324, attaching, by thermally conductive adhesive, the second piping over each first end of a first number of micro flat heat pipes, and attaching, by thermally conductive adhesive, the fourth piping over each first end of a second number of micro flat heat pipes, the first number and the second number equaling the plurality of micro flat heat pipes.

The method further comprising attaching, by thermally conductive adhesive, electrode ends of a temperature sensor 306 to the back surface.

The method additionally comprising electrically connecting each thermoelectric generator, each junction box of the photovoltaic panel, a battery 387, the temperature sensor 306 and a grid connector to a controller 303.

The method for assembling a cooling system further comprises at least one of: electrically connecting a power input of the controller to the battery, electrically connecting a power input of the controller to at least one junction box, and electrically connecting a power input of the controller to the grid.

The following methodology has been used while conducting the experiment;

a) First, a required solar irradiance value is fixed by changing the distance between the solar simulator (eight halogen lights) and the PV panel. For the monocrystalline panel an irradiance of 460 W/m$^2$ was achieved by placing the lights a distance of 1.3 m from the panel and adjusting the direction of each halogen light.

b) The panel was adjusted through a flexible support at an angle of zero degrees with the help of protractor.

c) The panel was cleaned for any dust with wet tissue paper to negate the effect of dust particles.

d) The data acquisition devices for the measurement of the voltage, current, temperature and variable resistance were used for data recording by the measuring unit 303.

e) Before turning on the solar simulator, the room temperature and the panel temperature were recorded. After turning on the lights, the temperature of the panel increased initially very quickly and was measured by a thermocouple of the temperature sensor fixed on the backside of the panel. Steady state was achieved after 20 minutes and the temperature did not rise further. At steady state voltage and current values were recorded at the variable resistance.

f) To simulate the cooled water from an air conditioning condenser, cold water was supplied by a chiller at a fixed temperature;

g) Thermal images were captured by an infrared camera after reaching the steady state and turning off the lights, to capture the heat distribution on the front side of the panel. Panel heat distributions were tested for different configurations of panels and light simulation.

h) The HP and TEG were fixed at the back of the panel with the help of an adhesive and any airgaps were filled with a spacer, preferably aluminum.

The following control parameters for the experiment were:

i) the number of heat pipes (independent parameter);
ii) water flow rates (independent parameter);
iii) temperature of the inlet flow (dependent parameter).

The initial conditions for the experimental monocrystalline panel were compared to the specification details by the panel manufacturer. The results for an irradiance of 360 W/m$^2$ were compared at a distance of 1.3 m between the panel and the solar simulator. The power output curves and the current-voltage characteristics curve results matched those of the panel manufacturer, which indicated that the panel was not operating at an excessive temperature.

The experimental conditions for the experimental polycrystalline panel were compared to the specification details by the panel manufacturer. The panel output power at an irradiance of 1000 W/m$^2$ was measured. The output power was 15 W at an irradiance of 1000 W/m$^2$ with short circuit current and open circuit voltages matching those of the panel manufacturer, which indicated that the panel was not operating at an excessive temperature.

Testing was performed by using a chiller to simulate the condensate. The testing was performed on the two different types of silicon panels: monocrystalline and polycrystalline photovoltaic panels. Results showed a 25% reduction in average temperature on the polycrystalline photovoltaic panel. In addition, power was calculated by measuring voltage and current and a significant increase of 45% was gained when the photovoltaic panel was cooled by heat pipes. An additional two watts of energy was produced by thermoelectric generators when incorporated into a panel with heat pipes, raising the total power produced by 63.5%.

A feasibility study for the hybrid system is described. A model of a house located in a hot climate, such as the climate of Saudi Arabia, was generated to conduct the analysis. Energy generation revenue for four million houses was shown to be an extra 30 billion SR or $8,000,000 U.S. over a 20 year time period using the hybrid photovoltaic panel system of the present disclosure versus a conventional photovoltaic panel system without energy compensation.

For the monocrystalline photovoltaic panel, the experiments were carried out in two stages. The first stage was to measure response of the photovoltaic panel without cooling (i.e., no HPs or TEGs are attached to the surface of the cell) under a specified irradiance condition. The second stage of the experiment was to measure the response of the photovoltaic panel when the back surface of the photovoltaic panel was attached to eight heat pipes and eight thermoelectric generators as shown in FIG. 3C.

Figure 4:
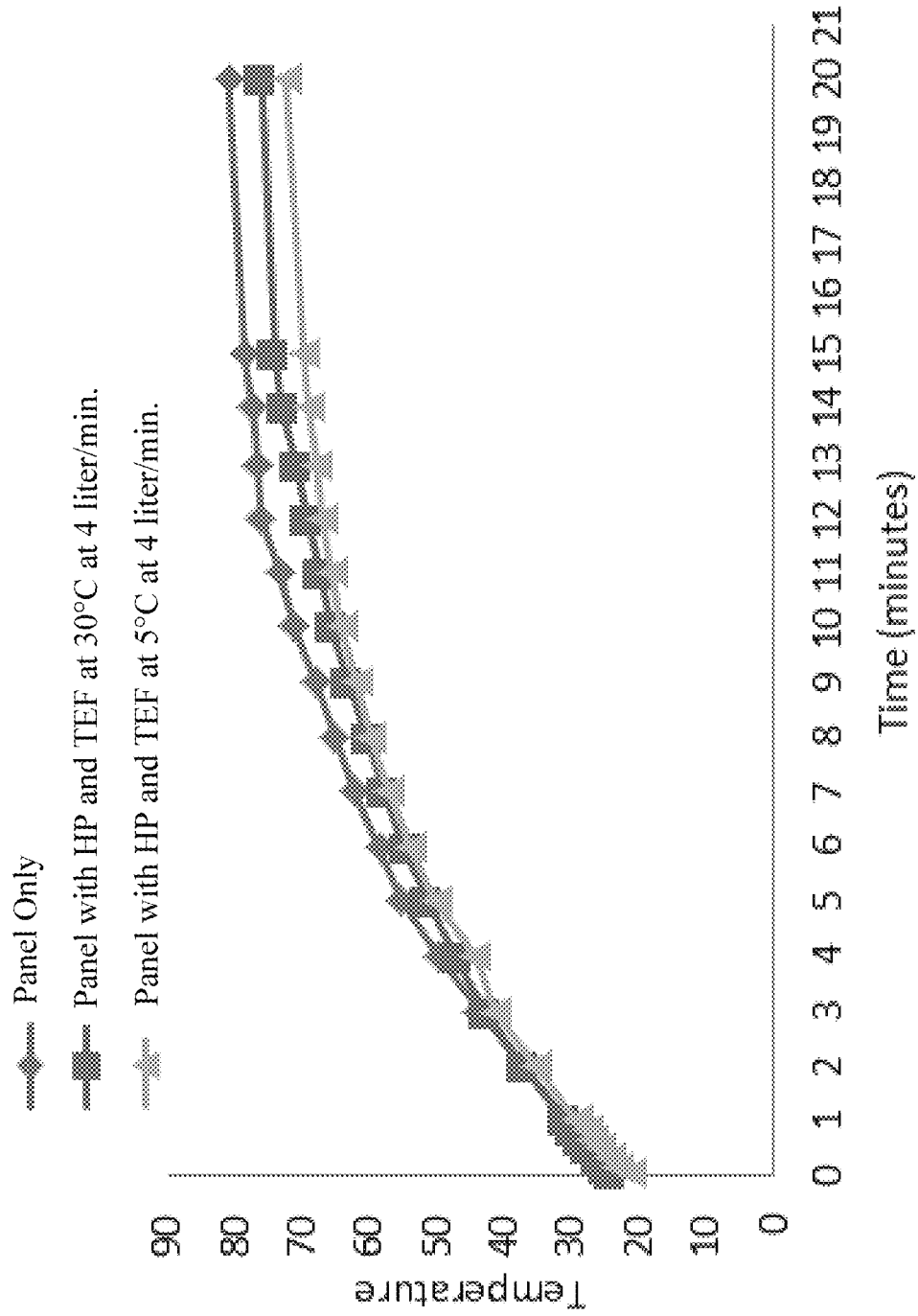
FIG. 4 is a graph illustrating the monocrystalline photovoltaic panel temperature variation with time at radiation=360 W/m$^2$.
Figure 5:
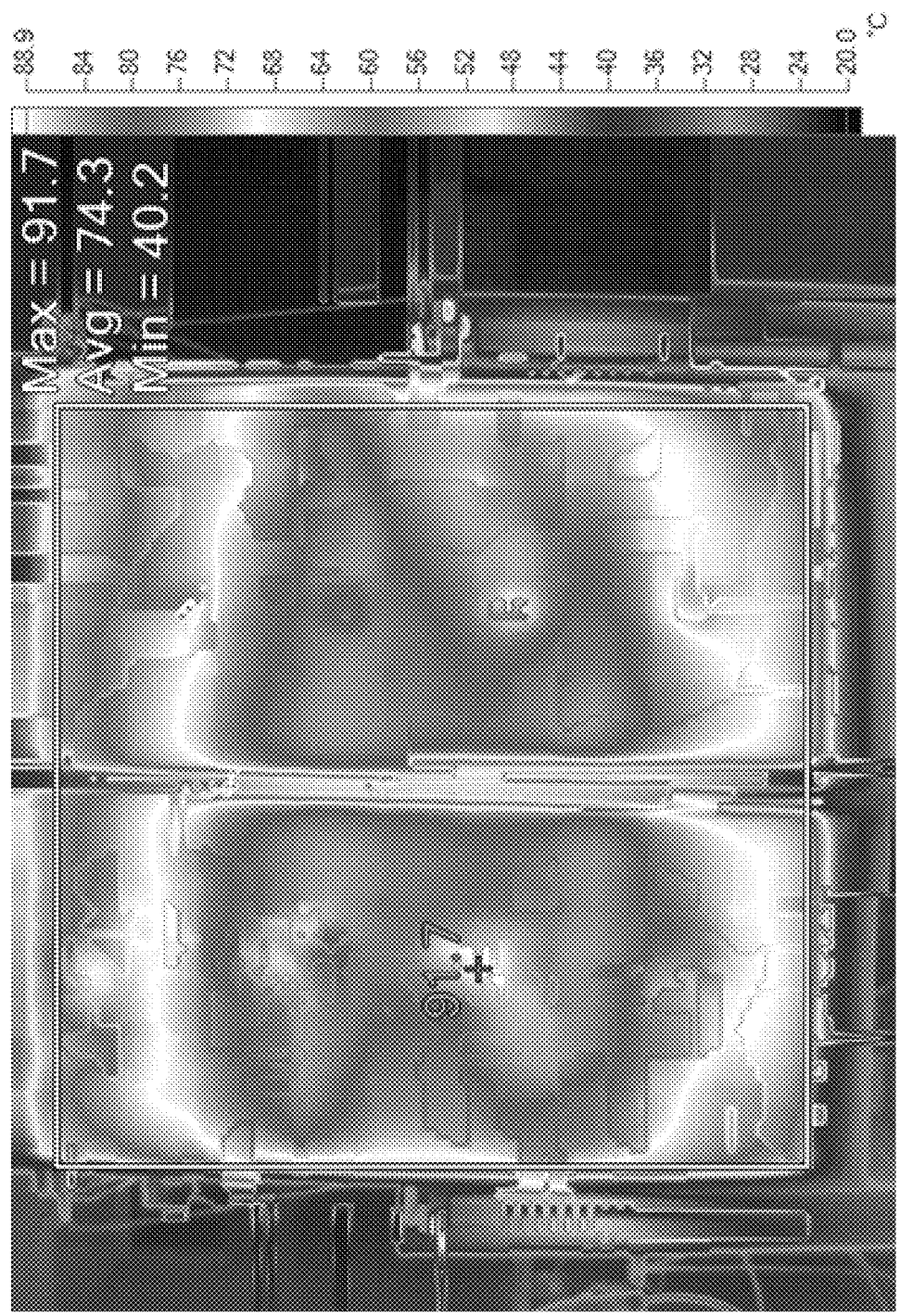
FIG. 5 illustrates the temperature distribution of a monocrystalline photovoltaic panel without cooling.
Figure 6:
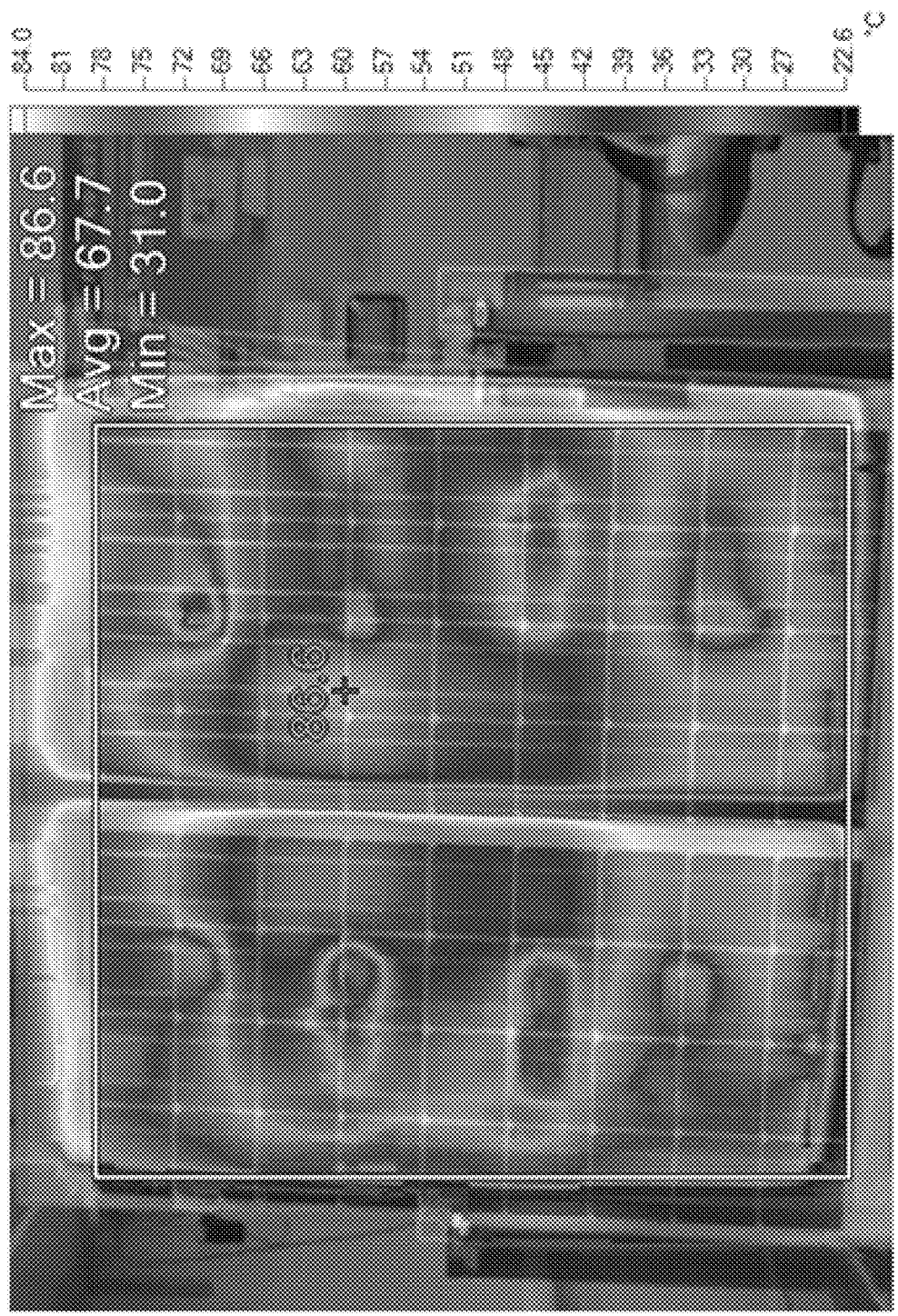
FIG. 6 illustrates the temperature distribution of a monocrystalline photovoltaic panel with heat pipes and TEGs at 30° C.
Figure 7:
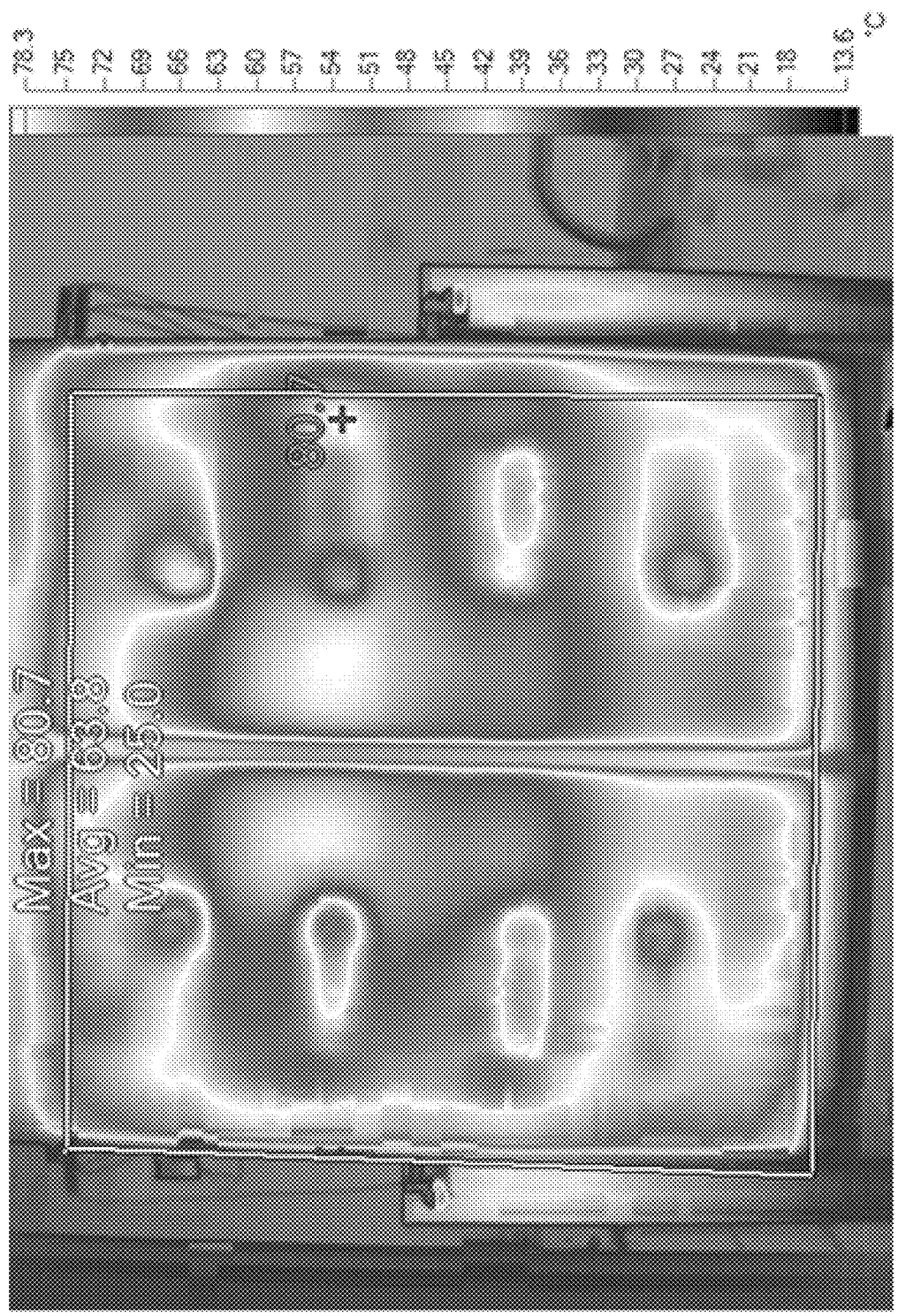
FIG. 7 illustrates the temperature distribution of a monocrystalline photovoltaic panel with heat pipes and TEGs at 5° C.

FIG. 4 shows the variation of photovoltaic panel temperature with time for the monocrystalline solar cell panel at a radiation 460 W/m$^2$ and an ambient temperature of 22° C. FIG. 4 shows that the temperature increases dramatically at first then gradually until reaches its steady state condition after about 15 minutes. FIGS. 5, 6, and 7 show the steady-state surface temperature distribution of the solar cell when there is no cooling, cooling at inlet water temperature 30° C., and cooling at inlet water temperature 5° C., respectively. The flow of cooling water is 4 liters/minute. These figures show that the average temperatures of the solar cell are at averages 74.3° C., 67.7° C., 63.8° C. for no cooling, cooling at 30° C., and cooling at 5° C., respectively. This indicates that the cooling system of the present disclosure is able to reduce the average temperature by 10.5° C. (i.e. 14.3%).

Figure 8:
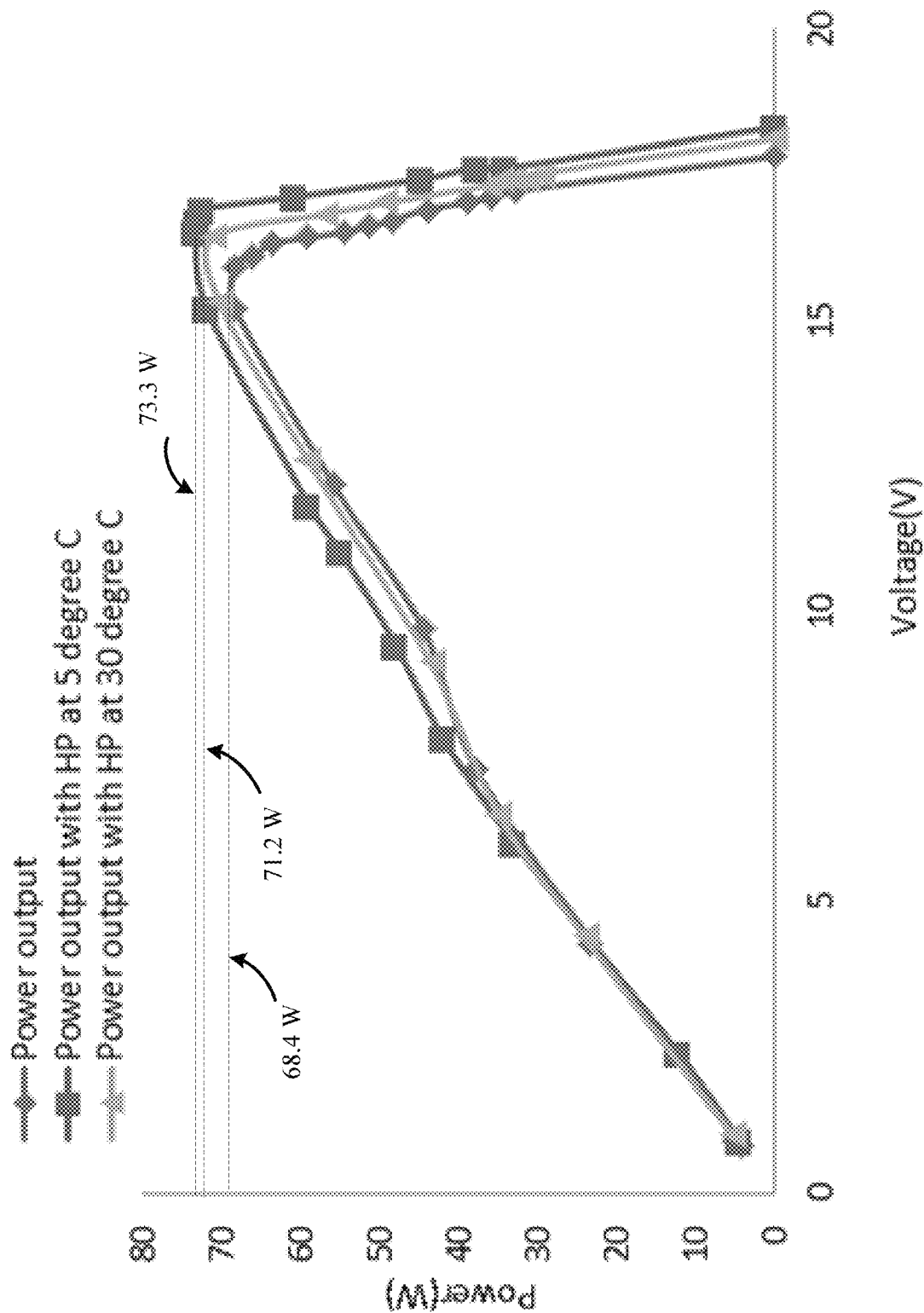
FIG. 8 is a graph illustrating the power curve characteristic of the monocrystalline photovoltaic panel with and without cooling.

FIG. 8 shows the power characteristic curve of the monocrystalline photovoltaic panel for three different cases, namely, the curve of the photovoltaic panel without cooling, with cooling at inlet water temperature 5° C., and with cooling at inlet water temperature 30° C. The maximum power of the photovoltaic panel without cooling is 68.4 W; while the maximum power of cooled photovoltaic panel at 30° C. and 5° C. are 71.2 W and 73.3 W, respectively. In other words, there are increases in the maximum power output of 4% and 7.2% at 30° C. and 5° C., respectively. In addition, the thermoelectric generators (eight TEGs) generate an extra amount of power of about 2 W. Thus, the total amount of power produced by the integrated system is 75.3 W (i.e. 10.1% increase compared to an uncooled photovoltaic panel).

The second experiment used the polycrystalline photovoltaic panel. For this panel, four heat pipes were arranged as in FIG. 2A, each heat pipe 232 placed over two thermoelectric generators 252 as shown in FIG. 2B. The heat pipes were fluidly connected by a manifold to heat sinks immersed in a reservoir of cooled water as for the first experiment. The thermoelectric generators 252 and junction box of the panel were electrically connected to the measuring system 303 to measure the power output.

Firstly, an experiment was carried out to test the performance of the solar cell without adding any heat pipes or thermoelectric generators.

Secondly, the four heat pipes were fluidly connected to the manifold in order to measure the output without adding the thermoelectric generators. Finally, the eight thermoelectric generators 252 were attached between the heat pipes 232 and the photovoltaic panel back plate to measure the power output.

Figure 9:
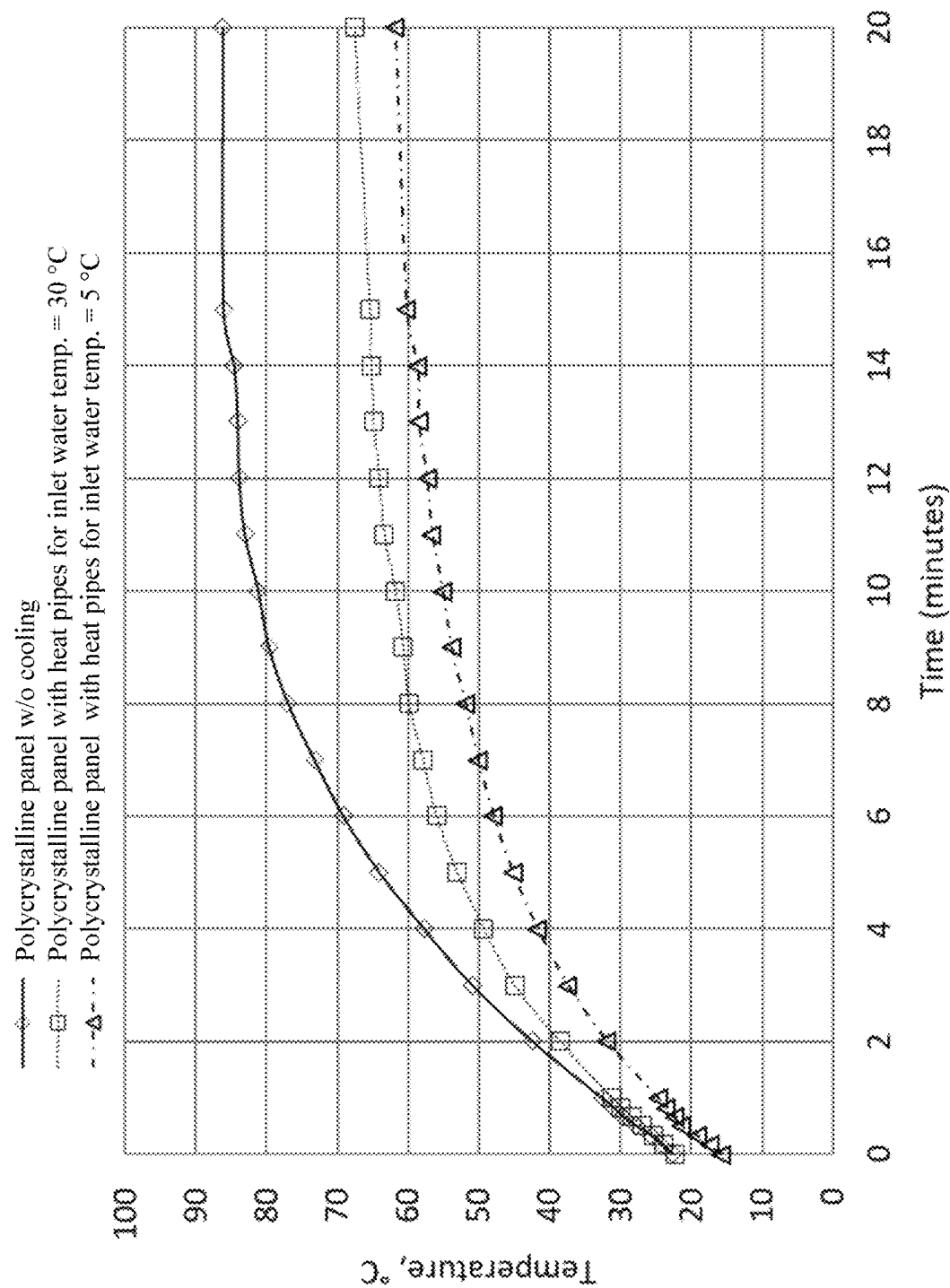
FIG. 9 is a graph illustrating the polycrystalline photovoltaic panel temperature variation with time at radiation=1000 W/m$^2$.
Figure 10:
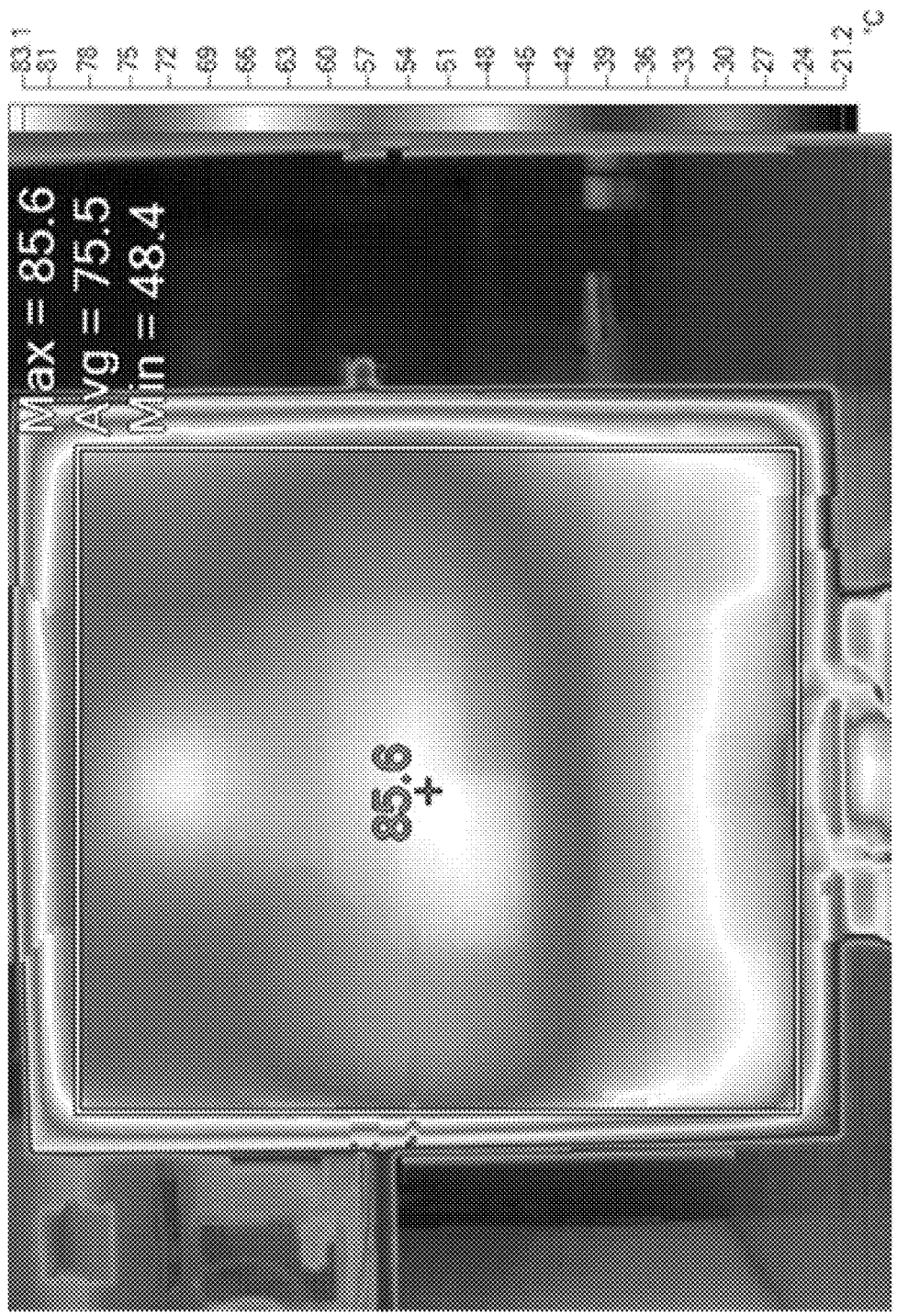
FIG. 10 illustrates the temperature distribution of a polycrystalline photovoltaic panel without cooling.
Figure 11:
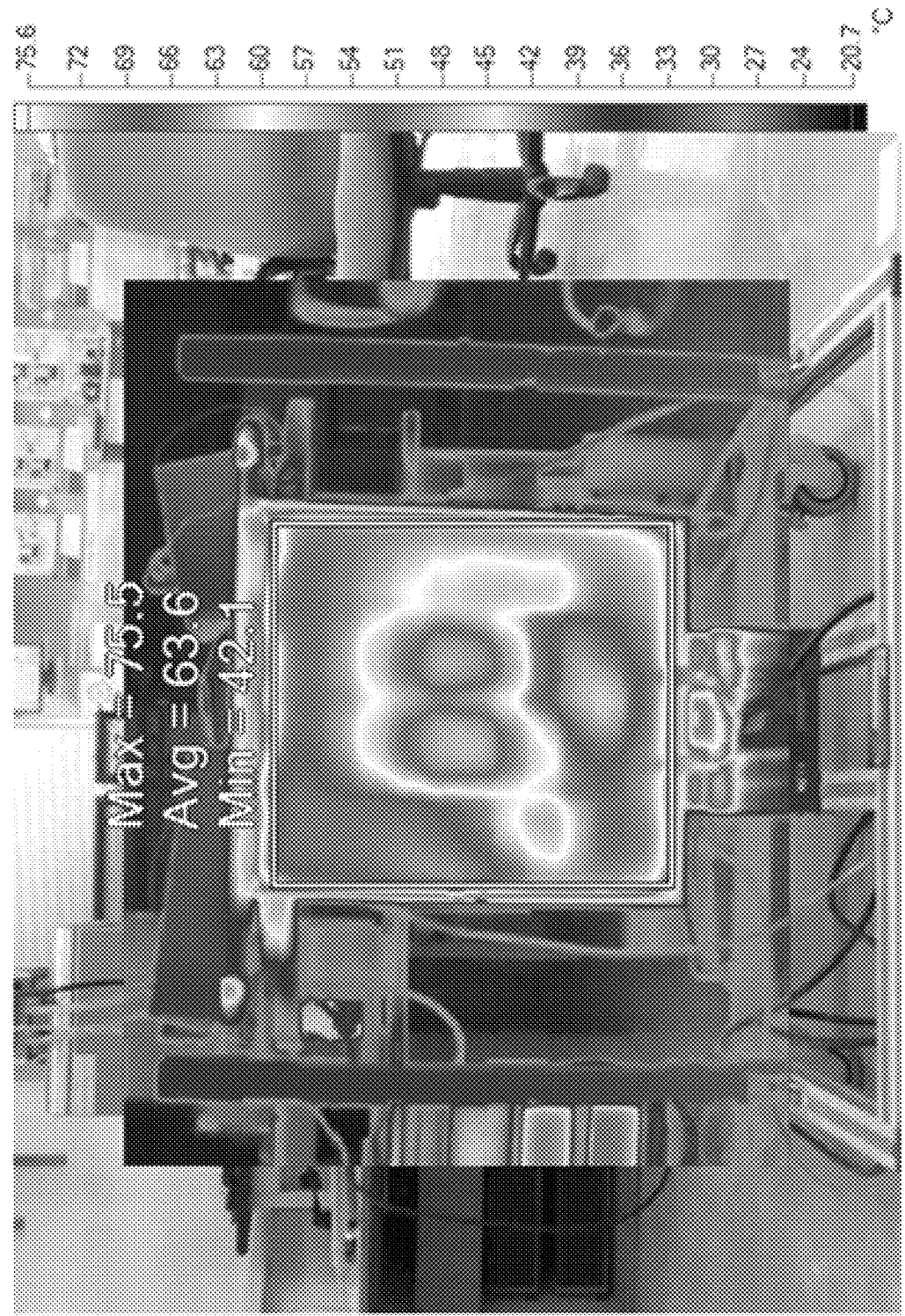
FIG. 11 illustrates the temperature distribution of a polycrystalline photovoltaic panel with heat pipes at 30° C.
Figure 12:
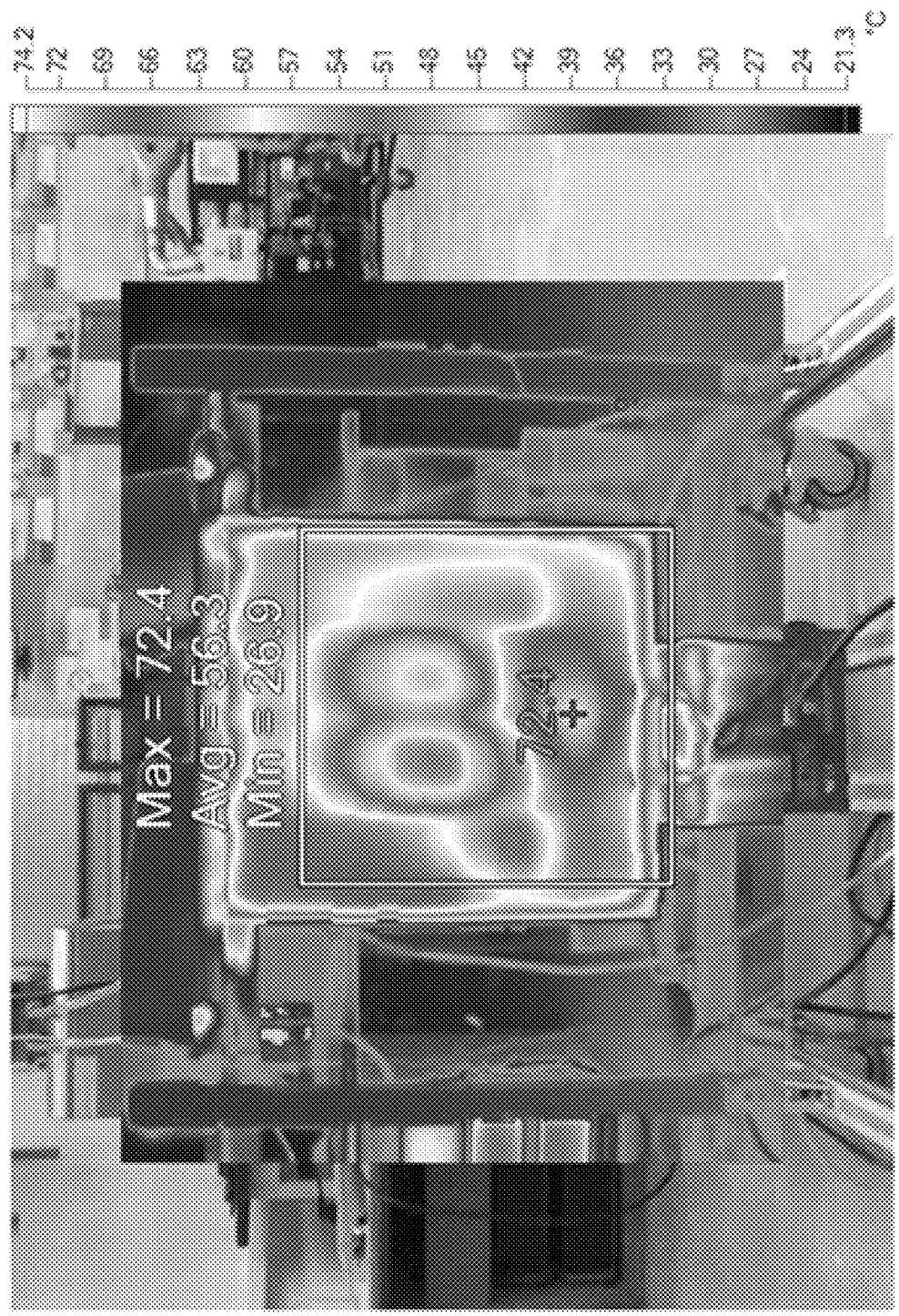
FIG. 12 illustrates temperature distribution of a polycrystalline photovoltaic panel with heat pipes at 5° C.

FIG. 9 depicts the variation of photovoltaic panel temperature with time for the polycrystalline panel at radiation 1000 W/m$^2$ and an ambient temperature of 22° C. and water flow rate of 4 l/m. The temperature sharply then gradually increases until reaches its steady state condition. Also, there was a significant drop of the temperature when the solar cell was cooled by the heat pipes. FIGS. 10, 11, and 12 show the steady-state surface temperature distribution of the photovoltaic panel when there is no cooling, cooling at inlet water temperature 30° C., and cooling at inlet water temperature 5°

Figure 13:
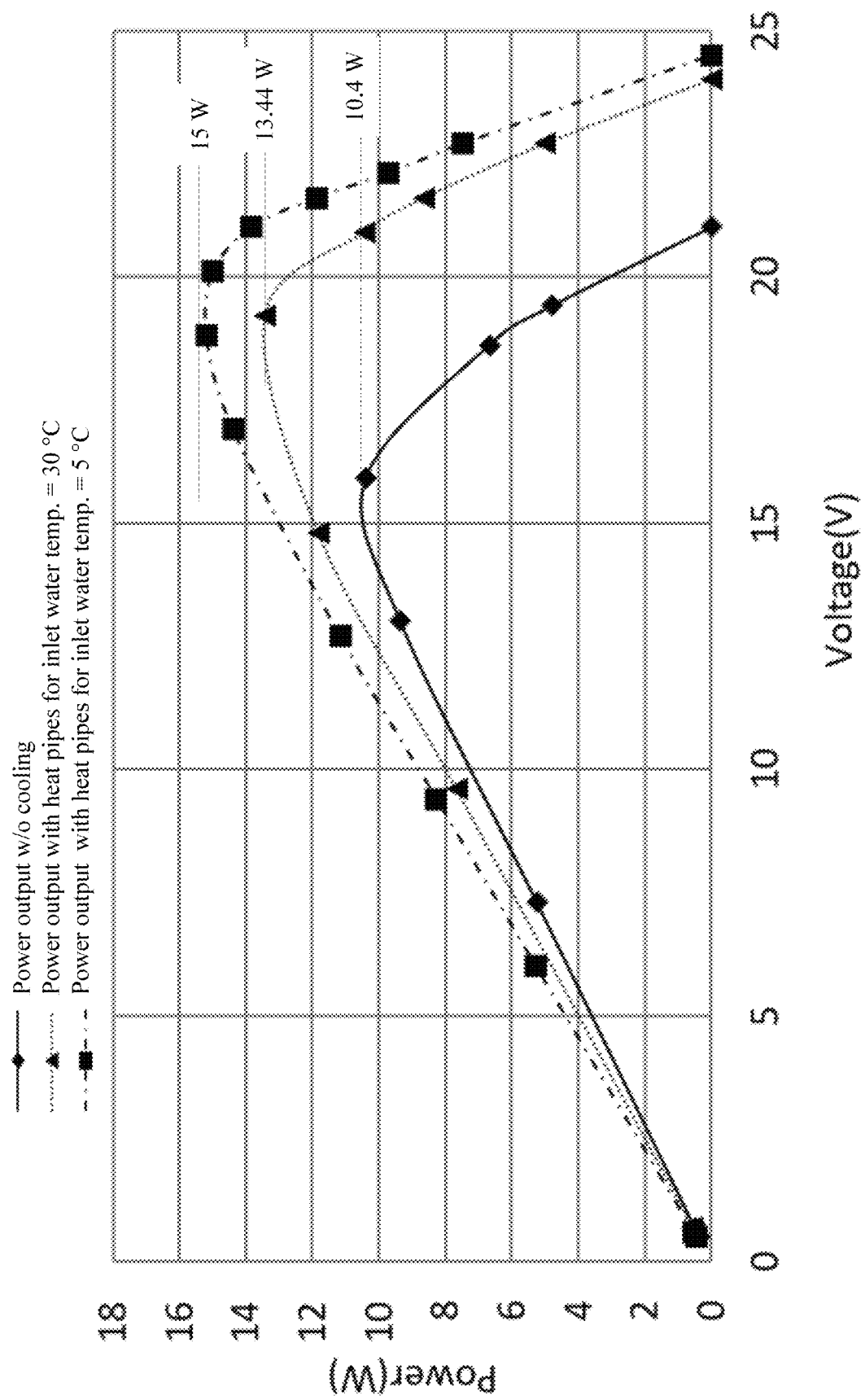
FIG. 13 is a graph illustrating the power output vs temperature at an irradiance of 1000 W/m$^2$.

C., respectively. These figures show that the average temperatures of the solar cell are 75.5° C., 63.6° C., 56.3° C., for no cooling, cooling at 30° C., and cooling at 5° C., respectively. This indicates that the cooling system of the present disclosure is able to reduce the average temperature of the photovoltaic panel by 19.2° C. (i.e. 25.4%). The effect of the heat pipes on the maximum power of the panel is presented in FIG. 13. For the photovoltaic panel without cooling, the maximum produced power was found to be 10.4 W. When photovoltaic panel was cooled by HP, the maximum power output was increased to 13.44 W (29.2%) and 15 W (44.2%) for inlet water temperature at 30° C., and 5° C., respectively. Knowing that the maximum power of the photovoltaic panel at the standard condition is 15 W (as per manufacturer specifications), the cooling system can operate the photovoltaic panel at its optimal power.

Figure 14:
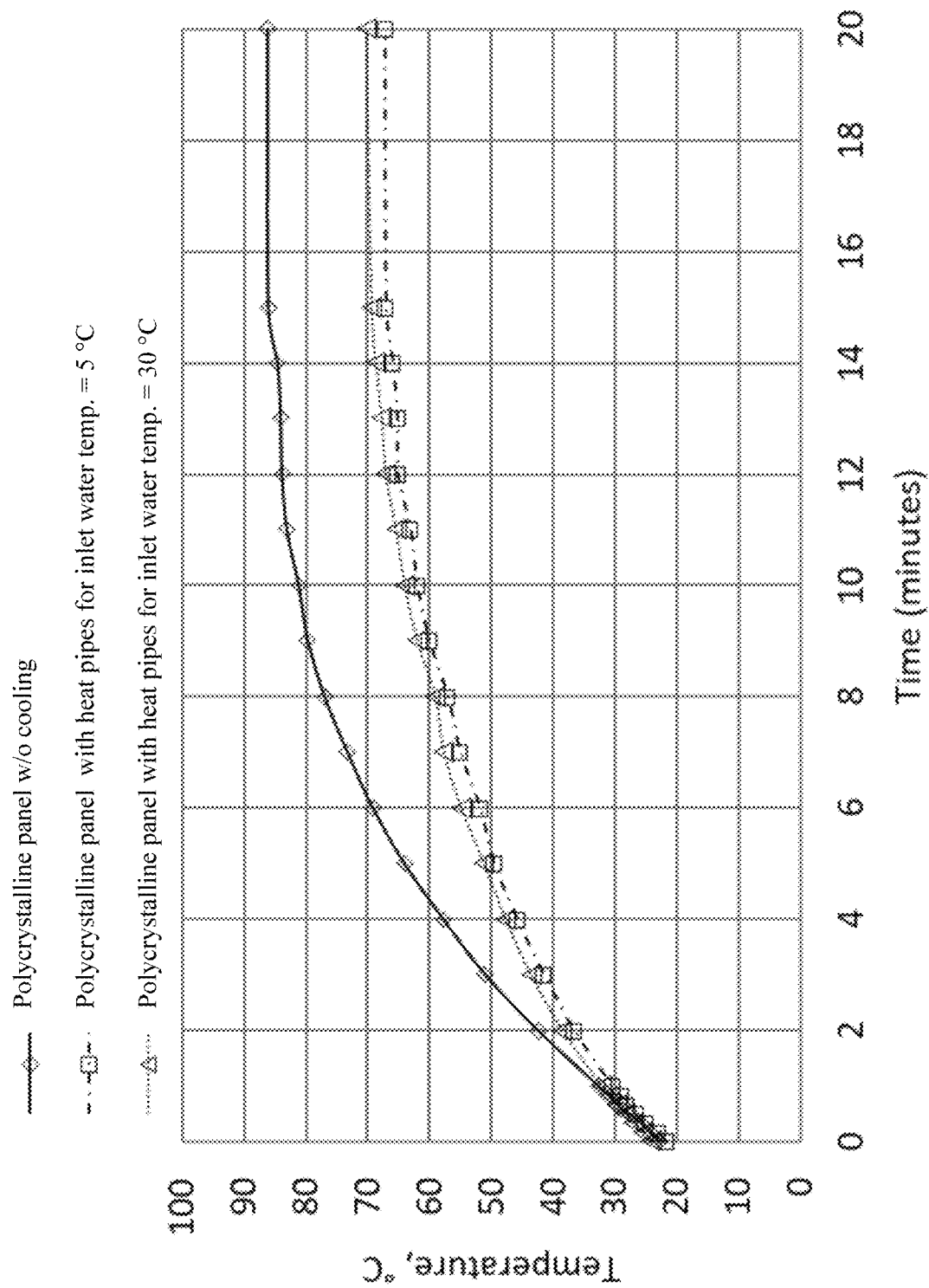
FIG. 14 is a graph illustrating the polycrystalline photovoltaic panel temperature variation with time at radiation=1000 W/m$^2$.

To study the effect of integrating thermoelectric generators to the system, eight TEGs were attached between the photovoltaic panel and the heat pipes as shown in FIG. 2B. FIG. 14 shows that there was a slight increase in the photovoltaic panel temperature when adding TEGs to the system. This was due to the increase in overall thermal resistance. However, the addition of TEGs led to the production of 2 W as extra power. The temperature of the panel without cooling was about 85° C. and after cooling dropped about 15° C. to about 65° C.

A feasibility study using a house model with a photovoltaic panel having a cooling system as described above installed is now described. The model house was designed according to temperature conditions in Damman City, in the Kingdom of Saudi Arabia, which has very high solar light intensities.

The roof area of the house available to hold the system was set at 150 m². The power generated was 7.5K W.

Figure 15:
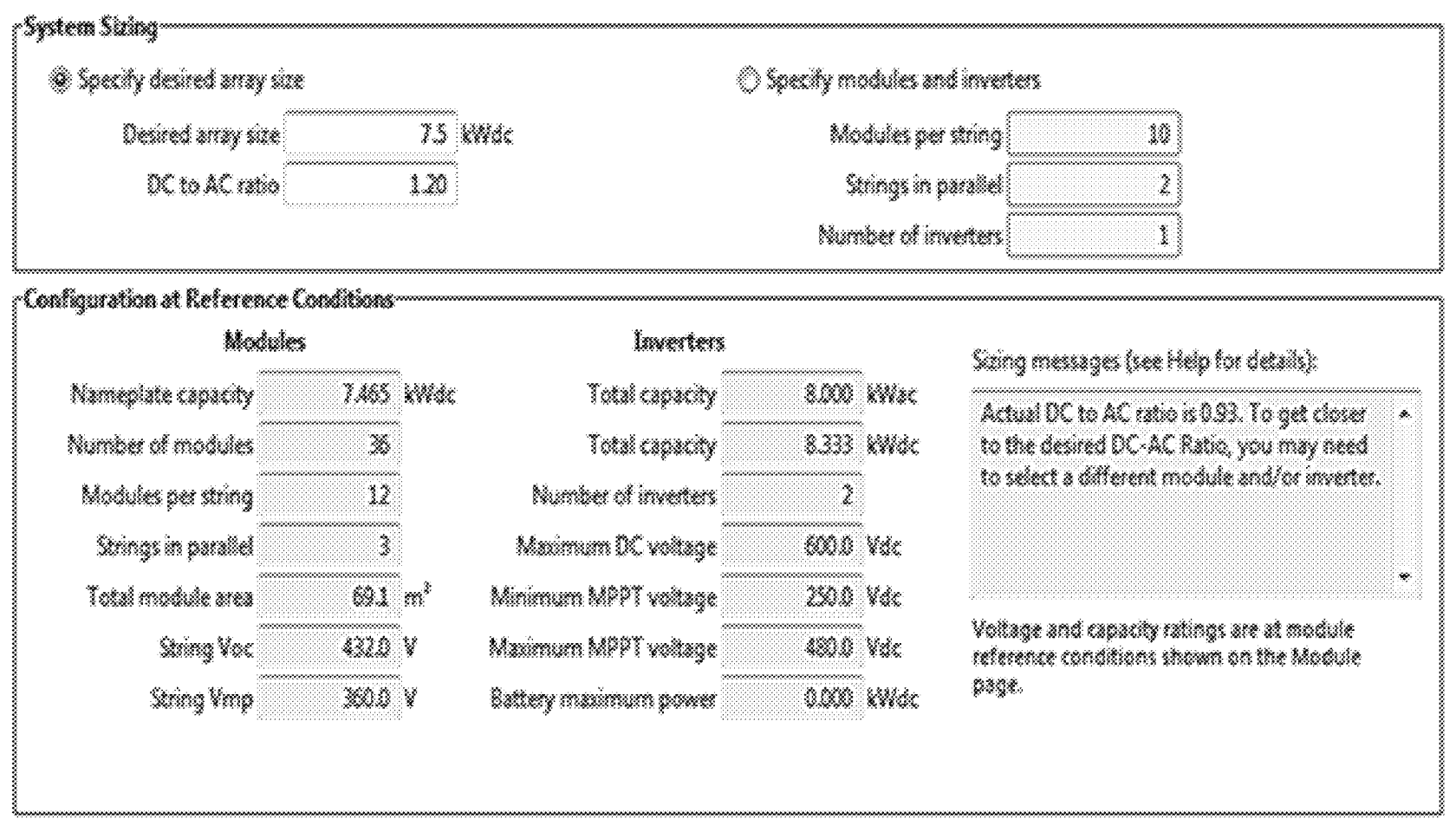
Figure 16:
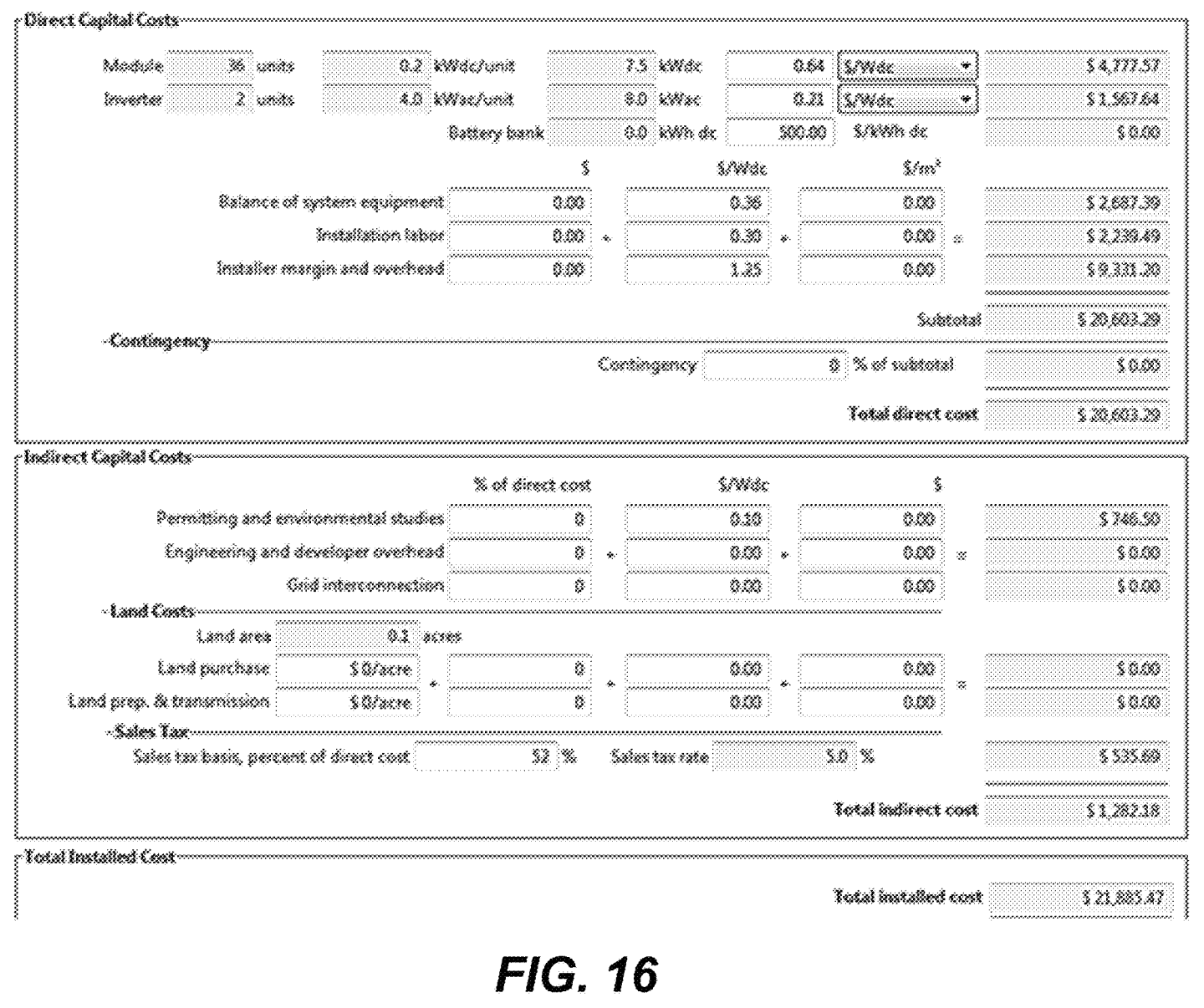

Data for the house model was sourced from the freely available NREL database was used to design the PV system using SAM software as shown in FIG. 15 and FIG. 16. (See NREL, https://pvwatts.nrel.gov/ and https://sam.nrel.gov/). The irradiance per month and output energy (kWh) were calculated using website pvwatts.nrel.gov. This website allows the entry of an address and calculates estimates of savings using PV systems. The results are illustrated in Table 3.

TABLE 3

Monthly irradiance accumulation and power output.

| Month | Solar Radiation (kWh/m²/day) | Plane of Array Irradiance (W/m²) | DC array Output (kWh) | AC System Output(kWh) |
|---|---|---|---|---|
| 1 | 5.66578913 | 175.6394653 | 1065.593262 | 1021.255188 |
| 2 | 6.14025879 | 171.9272461 | 1016.674805 | 974.463562 |
| 3 | 6.38678455 | 197.9903259 | 1164.271606 | 1115.999145 |
| 4 | 6.45321178 | 193.5963593 | 1103.083984 | 1056.696045 |
| 5 | 6.94987392 | 215.4460907 | 1178.437378 | 1128.685913 |
| 6 | 7.32614231 | 219.7842712 | 1187.130127 | 1137.272095 |
| 7 | 7.26340675 | 225.1656036 | 1219.314575 | 1167.875854 |
| 8 | 7.318501 | 226.8735352 | 1206.780762 | 1156.360596 |
| 9 | 7.39285469 | 221.7856445 | 1185.602905 | 1137.043701 |
| 10 | 7.16660118 | 222.1646423 | 1221.00354 | 1171.490112 |
| 11 | 6.05624199 | 181.6872559 | 1020.735291 | 978.9238281 |
| 12 | 4.80211258 | 148.8654938 | 900.6920166 | 862.2816162 |
| Total | 78.92177867 | 2400.925934 | 13469.32025 | 12908.34766 |

From Table 3 the total output energy(kWh) equals 12908.3 kWh per year.

The generated electricity from an uncooled photovoltaic system is approximately worth $1,550 per year or $18,500 in U.S dollars over a 20 year period for an average electricity price of $0.12 per kWh.

The effect of temperature in degrees Celsius was calculated using Nasar solar software (https://nasrsolar.com/) for the same location. The effect of temperature on power production and output are shown in Tables 4 and 5 respectively.

TABLE 4

Effect of temperature on power production

| Month | Average of Tem. | Effect of Tem. On production |
|---|---|---|
| January | 20.81 | 2.10% |
| February | 21.66 | 1.62% |
| March | 24.09 | 0.46% |
| April | 28.62 | −7.24% |
| May | 33.67 | −17.34% |
| June | 36.47 | −22.94% |
| July | 33.11 | −26.22% |
| August | 38.28 | −26.56% |
| September | 36.42 | −22.84% |
| October | 32.51 | −15.02% |
| November | 27.52 | −5.04% |
| December | 23.12 | 0.94% |

TABLE 4

Effect of temperature on energy output.

| Month | Average of Tem. | Effect of Tem. On production | Ac Energy (kWh) | AC energy with the effect of Tem. |
|---|---|---|---|---|
| January | 20.81 | 2.10% | 1021.255188 | 1042.701547 |
| February | 21.56 | 1.57% | 574.463562 | 990.7371035 |
| March | 24.09 | 0.46% | 1115.999145 | 1121.132742 |
| April | 28.52 | −7.24% | 1056.595045 | 980.1912513 |
| May | 33.67 | −17.34% | 1128.685913 | 932.9717758 |
| June | 35.47 | −22.94% | 1137.272095 | 876.3818752 |
| July | 38.11 | −26.22% | 1167.875854 | 851.6588054 |
| August | 38.28 | −26.56% | 1155.360595 | 849.2312215 |
| September | 36.42 | −22.84% | 1137.043701 | 877.342919 |
| October | 32.51 | −15.02% | 1171.490112 | 995.5322974 |
| November | 27.52 | −5.04% | 978.9238281 | 929.5860672 |
| December | 23.12 | 0.94% | 852.2816162 | 870.3870634 |
| Total | | | 12.908 | 11327.85467 |

From Table 5, it can be determined that the temperature reduces the average output energy by approximately 12% from moderate temperature conditions to the highest temperatures. In addition, such high temperatures reduce the life time of the PV panel.

For this model system, there are 36 panels each configured with five heat pipes for a total of 180 heat pipes. The cost of the heat pipes was estimated, to be:

pipe cost=180×50=9000 SR or $2400 U.S.

The installation cost for the cooling system and pump was estimated to be 6000 SR or about $1600 U.S.

Therefore, the total cost of the cooling system equals 15000 SR or $4,000 U.S., which equal approximately 18% of the total cost for the solar panels.

The output energy of the system decreases approximately 1% each year, due to heat and weather condition. If the heat pipes are used the decrease can be approximately 0.4%. Using this information above and the price of the kWh=1

SR, the calculation of the output energy for 20, 10 and 6 years as shown in Table 6 for both Saudi Riyals and U.S. dollars.

TABLE 6

Output energy price for 20, 10, and 7.5 years

|  | 20 years | 10 years | 7.5 years |
| --- | --- | --- | --- |
| Total cost with HP (in SR) | 247840 | 126052 | 95724 |
| Total cost w/o HP (in SR) | 203901 | 107615 | 81773 |
| Total cost with HP (in U.S.) | $66,073 | $33,605 | $25,520 |
| Total cost w/o HP (in U.S.) | $54,359 | $28,690 | $21,800 |

Comparing Tables 4 and 6, it is clear that the cost of the system will be recuperated in 7.5 years for both cases. Also it is shown that the total electrical output with heat pipes is greater than that without heat pipes. The difference covers the price of heat pipe and leaves a net profit of about 30000 SR or $8,000 U.S. in 20 years for one house in hot countries, such as Saudi Arabia. There are 4 million houses in Saudi Arabia based on a census from 2014, thus the net profit is about 120 billion Saudi Riyals or $32,000,000 U.S. with a total generating capacity of 30 GW.

In summary, the experiments verified the use of heat pipes and TEGs with cooled water from air conditioning condenser units to lower the temperature of the panel and increase the power output. Additionally, the TEGs generated an extra amount of power while transferring heat to the heat pipes from the photovoltaic panel. Thus, utilizing condensed water form air conditioning systems to cool photovoltaic panels is able to significantly increase the electric conversion efficiency, adding TEGs to the system produces extra power and increases the overall efficiency of the system, and using micro flat heat pipe cooling system in the photovoltaic system operates the system at optimal power and increases the panel lifespan.

Figure 17:
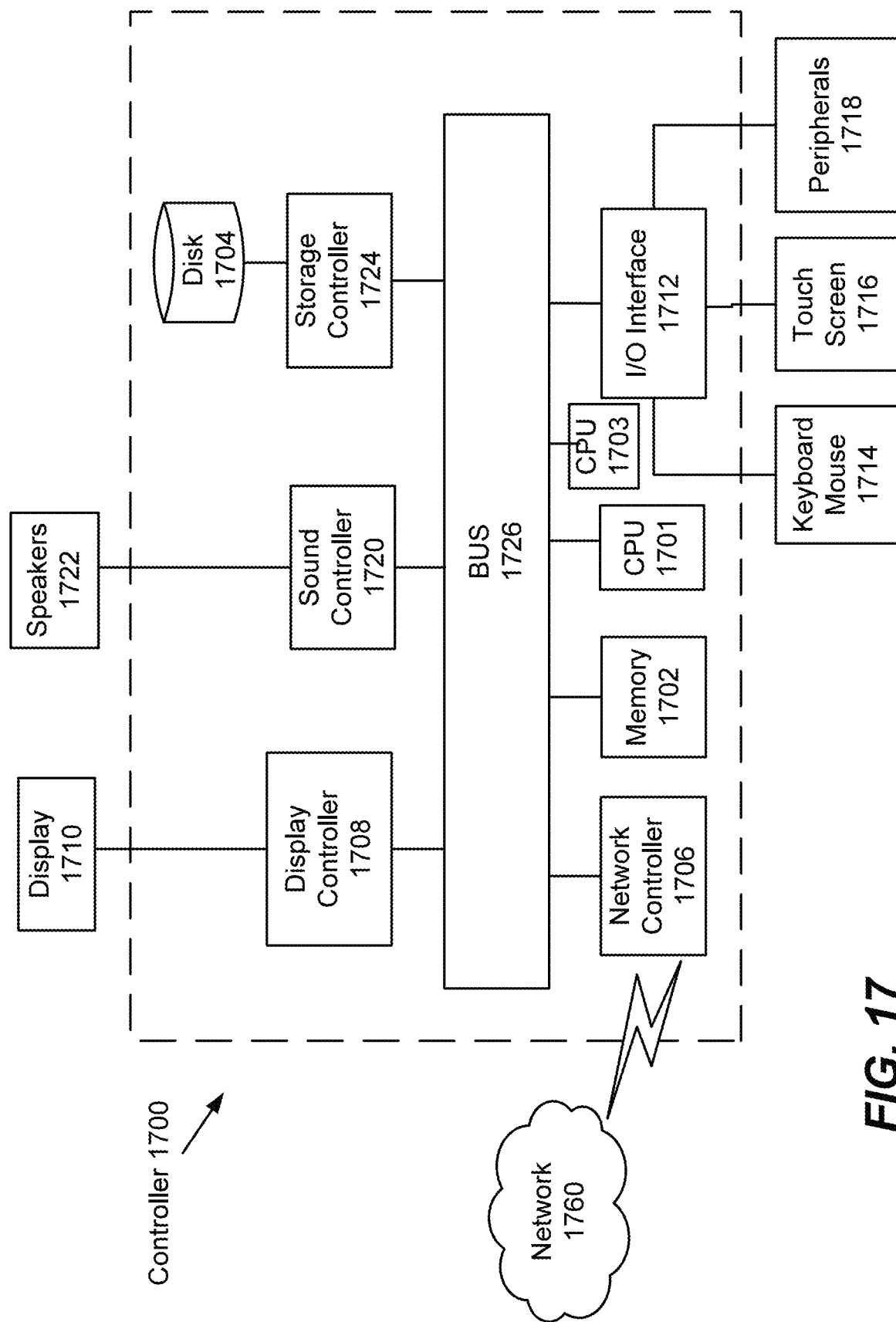
FIG. 17 is an illustration of a non-limiting example of details of computing hardware used in the controller of the measuring system, according to certain embodiments.

Next, further details of the hardware description of the controller 303 of FIG. 3A according to exemplary embodiments is provided with reference to FIG. 17. In FIG. 17, a controller 1700 is described is representative of the system 300 of FIG. 3A in which the controller is a computing device which includes a CPU 1701 which performs the processes described above/below. The process data and instructions may be stored in memory 1702. These processes and instructions may also be stored on a storage medium disk 1704 such as a hard drive (HDD) or portable storage medium or may be stored remotely.

Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claimed advancements may be provided as a utility application, background daemon, or component of an operating system, or combination thereof, executing in conjunction with CPU 1701, 1703 and an operating system such as Microsoft Windows 7, UNIX, Solaris, LINUX, Apple MAC-OS and other systems known to those skilled in the art.

The hardware elements in order to achieve the computing device may be realized by various circuitry elements, known to those skilled in the art. For example, CPU 1701 or CPU 1703 may be a Xenon or Core processor from Intel of America or an Opteron processor from AMD of America, or may be other processor types that would be recognized by one of ordinary skill in the art. Alternatively, the CPU 1701, 1703 may be implemented on an FPGA, ASIC, PLD or using discrete logic circuits, as one of ordinary skill in the art would recognize. Further, CPU 1701, 1703 may be implemented as multiple processors cooperatively working in parallel to perform the instructions of the inventive processes described above.

The computing device in FIG. 17 also includes a network controller 1706, such as an Intel Ethernet PRO network interface card from Intel Corporation of America, for interfacing with network 1760. As can be appreciated, the network 1760 can be a public network, such as the Internet, or a private network such as an LAN or WAN network, or any combination thereof and can also include PSTN or ISDN sub-networks. The network 1760 can also be wired, such as an Ethernet network, or can be wireless such as a cellular network including EDGE, 3G and 4G wireless cellular systems. The wireless network can also be WiFi, Bluetooth, or any other wireless form of communication that is known.

The computing device further includes a display controller 1708, such as a NVIDIA GeForce GTX or Quadro graphics adaptor from NVIDIA Corporation of America for interfacing with display 1710, such as a Hewlett Packard HPL2445w LCD monitor. A general purpose I/O interface 1712 interfaces with a keyboard and/or mouse 1714 as well as a touch screen panel 1716 on or separate from display 1710. General purpose I/O interface also connects to a variety of peripherals 1718 including printers and scanners, such as an OfficeJet or DeskJet from Hewlett Packard.

A sound controller 1720 is also provided in the computing device such as Sound Blaster X-Fi Titanium from Creative, to interface with speakers/microphone 1722 thereby providing sounds and/or music.

The general purpose storage controller 1724 connects the storage medium disk 1704 with communication bus 1726, which may be an ISA, EISA, VESA, PCI, or similar, for interconnecting all of the components of the computing device. A description of the general features and functionality of the display 1710, keyboard and/or mouse 1714, as well as the display controller 1708, storage controller 1724, network controller 1706, sound controller 1720, and general purpose I/O interface 1712 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 18.

Figure 18:
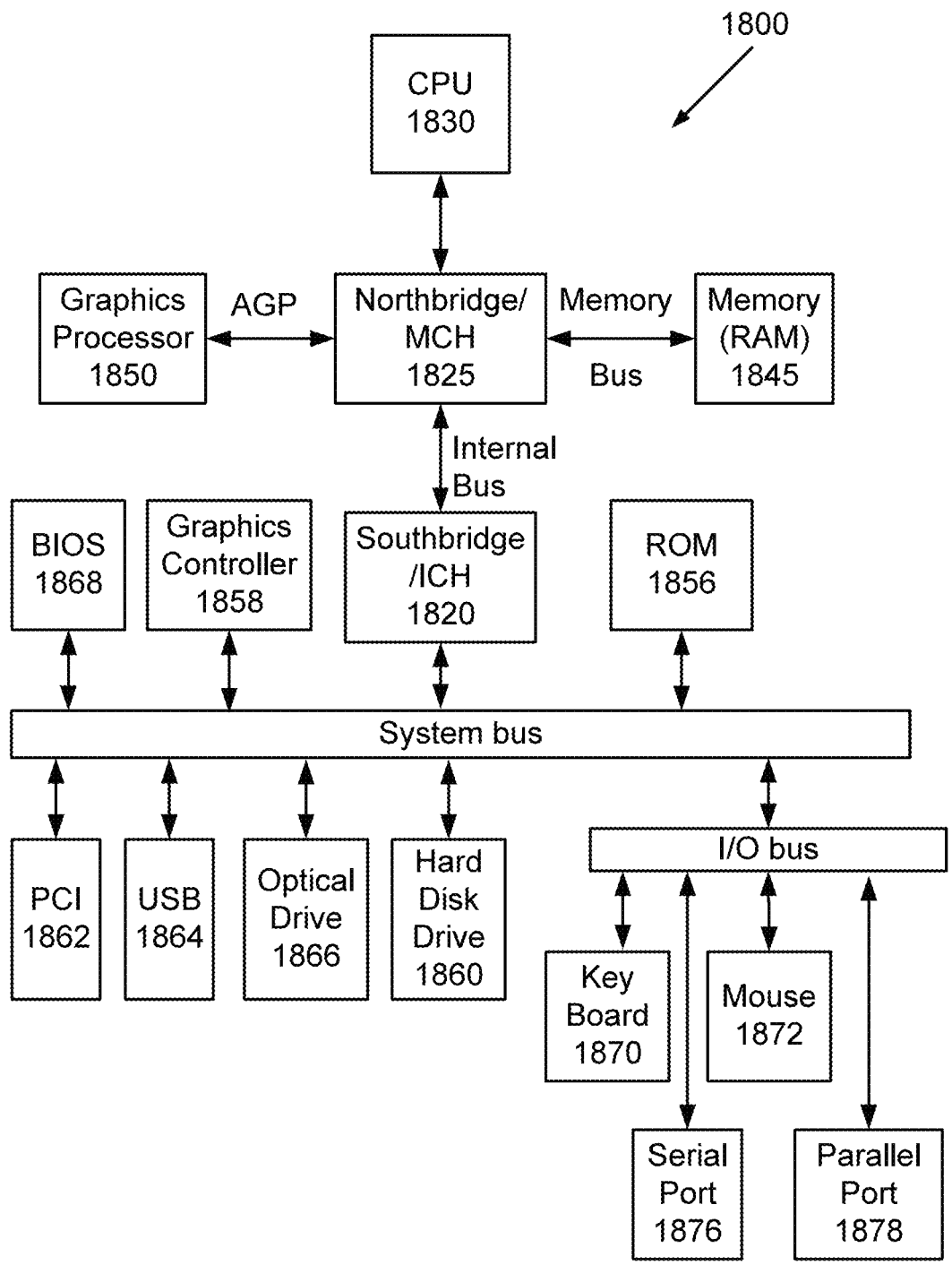
FIG. 18 is an exemplary schematic diagram of a data processing system used within the measuring system, according to certain embodiments.

FIG. 18 shows a schematic diagram of a data processing system, according to certain embodiments, for performing the functions of the exemplary embodiments. The data processing system is an example of a computer in which code or instructions implementing the processes of the illustrative embodiments may be located.

In FIG. 18, data processing system 1800 employs a hub architecture including a north bridge and memory controller hub (NB/MCH) 1825 and a south bridge and input/output (I/O) controller hub (SB/ICH) 1820. The central processing unit (CPU) 1830 is connected to NB/MCH 1825. The NB/MCH 1825 also connects to the memory 1845 via a memory bus, and connects to the graphics processor 1850 via an accelerated graphics port (AGP). The NB/MCH 1825 also connects to the SB/ICH 1820 via an internal bus (e.g., a unified media interface or a direct media interface). The CPU Processing unit 1830 may contain one or more processors and even may be implemented using one or more heterogeneous processor systems.

Figure 19:
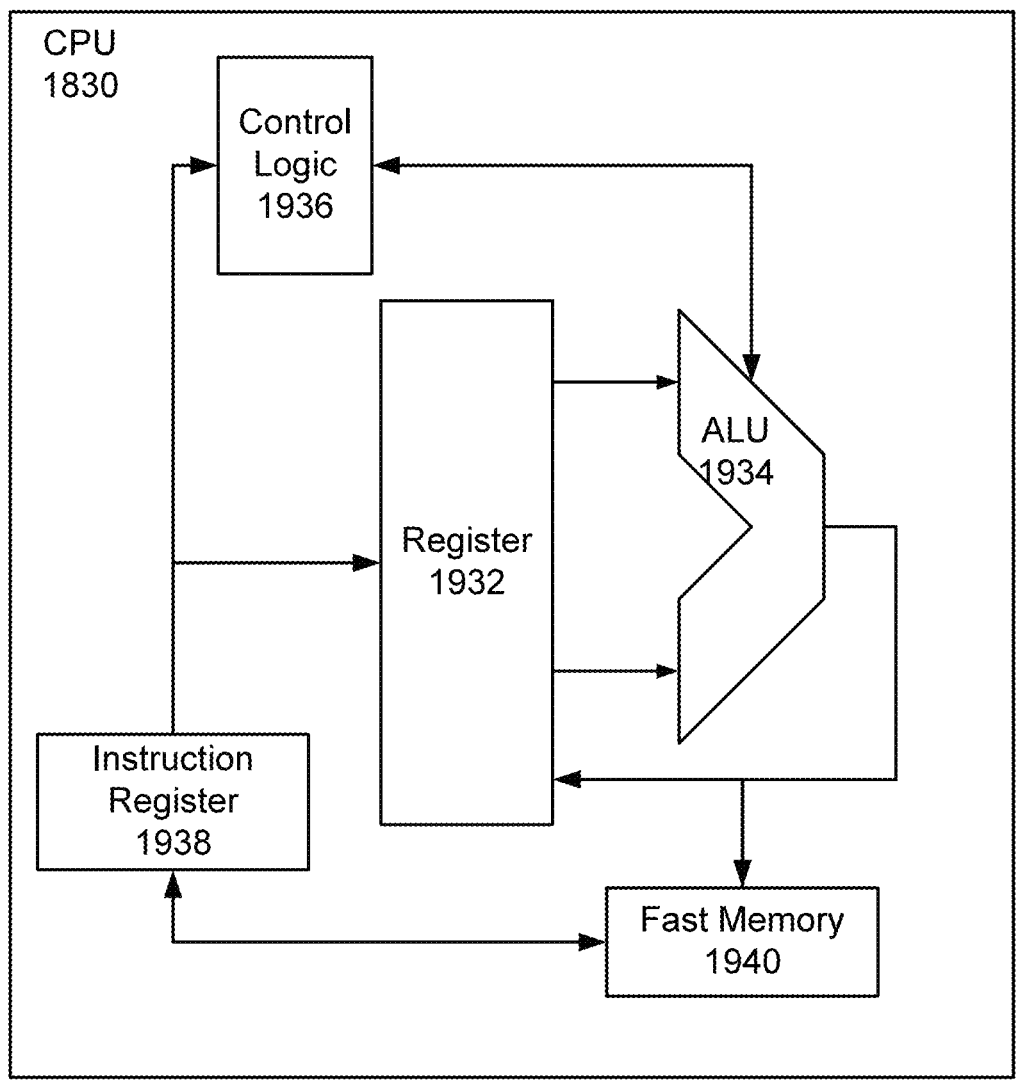
FIG. 19 is an exemplary schematic diagram of a processor used with the measuring system, according to certain embodiments.

For example, FIG. 19 shows one implementation of CPU 1830. In one implementation, the instruction register 1938 retrieves instructions from the fast memory 1940. At least part of these instructions are fetched from the instruction register 1938 by the control logic 1936 and interpreted according to the instruction set architecture of the CPU 1830. Part of the instructions can also be directed to the register 1932. In one implementation the instructions are decoded according to a hardwired method, and in another implementation the instructions are decoded according a microprogram that translates instructions into sets of CPU configuration signals that are applied sequentially over multiple clock pulses. After fetching and decoding the instructions, the instructions are executed using the arithmetic logic unit (ALU) 1934 that loads values from the register 1932 and performs logical and mathematical operations on the loaded values according to the instructions. The results from these operations can be feedback into the register and/or stored in the fast memory 1940. According to certain implementations, the instruction set architecture of the CPU 1830 can use a reduced instruction set architecture, a complex instruction set architecture, a vector processor architecture, a very large instruction word architecture. Furthermore, the CPU 1830 can be based on the Von Neuman model or the Harvard model. The CPU 1830 can be a digital signal processor, an FPGA, an ASIC, a PLA, a PLD, or a CPLD. Further, the CPU 1830 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 18, the data processing system 1800 can include that the SB/ICH 1820 is coupled through a system bus to an I/O Bus, a read only memory (ROM) 1856, universal serial bus (USB) port 1864, a flash binary input/output system (BIOS) 1868, and a graphics controller 1858. PCI/PCIe devices can also be coupled to SB/ICH 1888 through a PCI bus 1862.

The PCI devices may include, for example, Ethernet adapters, add-in cards, and PC cards for notebook computers. The Hard disk drive 1860 and CD-ROM 1866 can use, for example, an integrated drive electronics (IDE) or serial advanced technology attachment (SATA) interface. In one implementation the I/O bus can include a super I/O (SIO) device.

Further, the hard disk drive (HDD) 1860 and optical drive 1866 can also be coupled to the SB/ICH 1820 through a system bus. In one implementation, a keyboard 1870, a mouse 1872, a parallel port 1878, and a serial port 1876 can be connected to the system bus through the I/O bus. Other peripherals and devices that can be connected to the SB/ICH 1820 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

Figure 20:
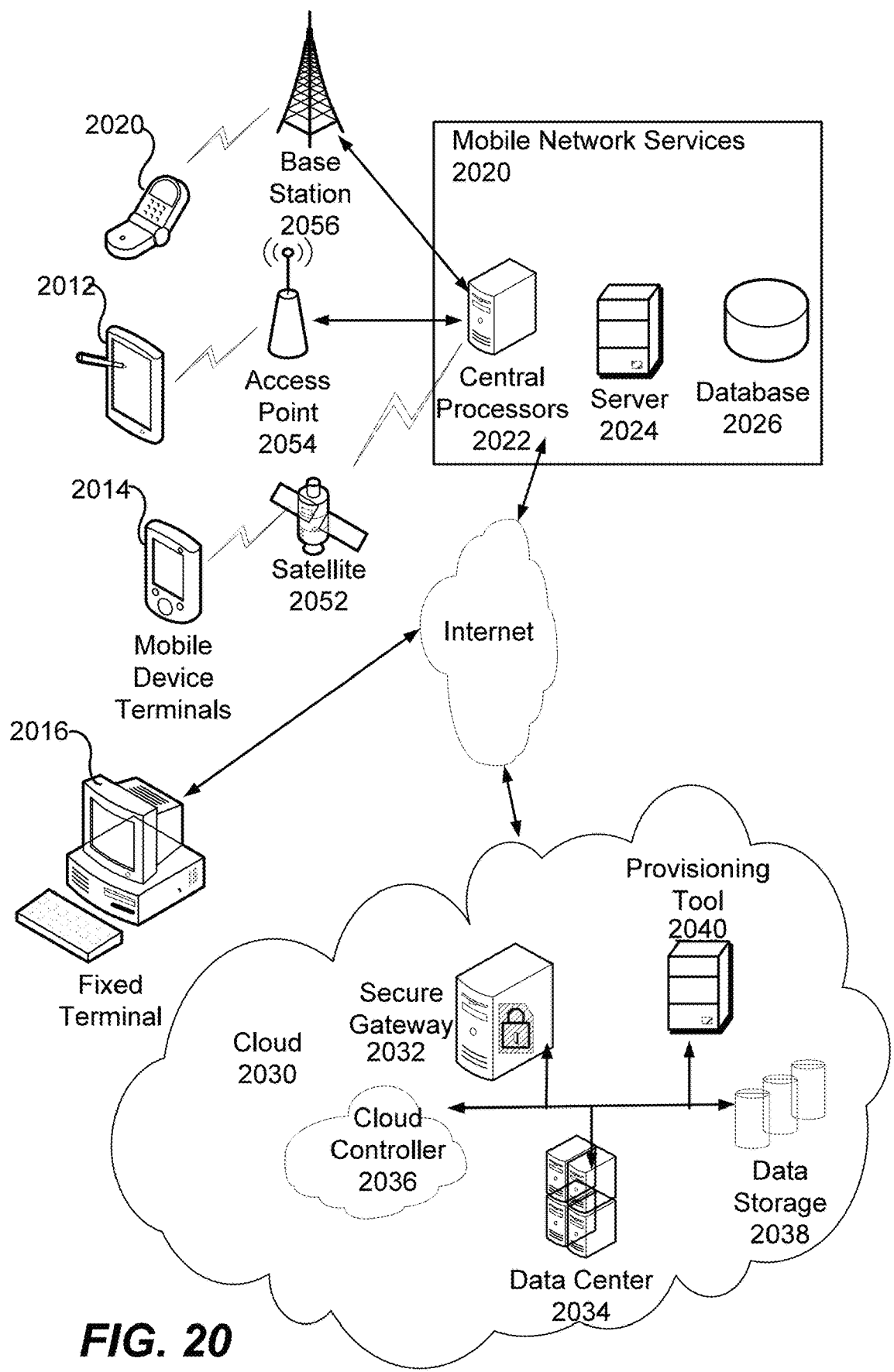
FIG. 20 is an illustration of a non-limiting example of distributed components which may share processing with the controller, according to certain embodiments.

The functions and features described herein may also be executed by various distributed components of a system. For example, one or more processors may execute these system functions, wherein the processors are distributed across multiple components communicating in a network. The distributed components may include one or more client and server machines, which may share processing, as shown by FIG. 20, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A photovoltaic panel system, comprising:
   a photovoltaic panel having a front surface, a back surface, a frame and at least one electrical junction box, wherein the photovoltaic panel is configured to generate electrical current from solar radiation impinging on the front surface;
   a plurality of thermoelectric generators having a first side and a second side, the first side attached to the back surface, wherein each thermoelectric generator is configured to generate electrical current when the first side is at a different temperature than the second side;
   a plurality of micro flat heat pipes, wherein each micro flat heat pipe is attached to an entirety of the second side of at least one of the thermoelectric generators, each micro flat heat pipe having a hot end and a cold end;
   a plurality of heat sinks, each heat sink comprising a water reservoir;
   at least one air conditioner comprising an evaporator and a condensate drain;
   a water pumping unit comprising a fluid manifold in thermal contact with the hot ends of the plurality of micro flat heat pipes and a pump fluidly coupled to each water reservoir and the condensate drain;
   a battery;
   a plurality of spacers, each of the spacers being provided between each of the plurality of micro flat heat pipes and the back surface only in areas of the back surface not covered by one of the thermoelectric generators, the spacers being configured to provide thermal contact between the micro flat heat pipes and the back surface in areas not covered by one of the thermoelectric generators, the thermoelectric generators being configured to provide thermal contact between the micro flat heat pipes and the back surface in areas not covered by one of the spacers, and the spacers directly contacting the back surface, the micro flat heat pipes, and the thermoelectric generators;
   a controller operatively connected to the pump, the plurality of thermoelectric generators, the at least one electrical junction box and the battery, the controller comprising circuitry and at least one processor, the controller configured to:

receive electrical current from the at least one electrical junction box and the plurality of thermoelectric generators;

control a speed of the pump; and invert the electrical current to charge the battery.

2. The photovoltaic panel system of claim 1, further comprising:

a temperature sensor connected to the back surface and the controller;

wherein the temperature sensor is configured to change resistance based on the temperature of the back surface; and wherein the controller is further configured to control the pump based on the resistance of the temperature sensor.

3. The photovoltaic panel system of claim 1, wherein the photovoltaic panel is a monocrystalline photovoltaic panel.

4. The photovoltaic panel system of claim 3, comprising 8 micro flat heat pipes and 8 thermoelectric generators.

5. The photovoltaic panel system of claim 1, wherein the photovoltaic panel is a polycrystalline photovoltaic panel.

6. The photovoltaic panel system of claim 5, comprising 4 micro flat heat pipes and 8 thermoelectric generators.

7. The photovoltaic panel system of claim 6, wherein each micro flat heat pipe is attached to the second sides of two thermoelectric generators.

8. The photovoltaic panel system of claim 2, wherein the controller is further configured to determine a state of charge of the battery; and wherein the controller further comprises switching circuitry configured to switch the battery to one of receiving charging current and providing voltage to the air conditioner.

9. The photovoltaic panel system of claim 2, wherein the controller is further configured to determine a state of charge of the battery; and wherein the controller further comprises switching circuitry configured to switch the battery to one of receiving charging current and providing voltage to a load.

10. The photovoltaic panel system of claim 9, wherein the controller further comprises switching circuitry configured to connect the electrical current directly to an electrical grid.

11. The photovoltaic panel system of claim 10, further comprising:

a display operatively connected to the controller, the display configured to show the temperature of the back surface, a speed of the pump, the current output from the at least one electrical junction box, the battery state of charge and an operational status of the air conditioner.

12. The photovoltaic panel system of claim 1, wherein the spacer is one of an aluminum spacer, a thermally conductive polymer spacer and a copper spacer.

13. A method for operating the photovoltaic panel system of claim 11, comprising:

receiving, by the controller comprising circuitry and the at least one processor having program instructions, a resistivity of the temperature sensor;

calculating, by the processor, the temperature of the back surface based on the resistivity;

comparing, by the processor, the temperature of the back surface to a temperature threshold;

if the temperature of the back surface is equal to or is below the temperature threshold, turning on the at least one electrical junction box;

if the temperature of the back surface is greater than the temperature threshold, turning on the pump, wherein turning on the pump causes condensate water to flow in the fluid manifold and remove heat from the hot ends of the micro flat heat pipes;

continuing to receive and compare the temperature of the back surface to the temperature threshold until the temperature of the back surface signal is equal to or below the temperature threshold, then turning on the at least one electrical junction box; and controlling the pump speed to keep the temperature of the back surface below the temperature threshold.

14. The method of claim 13, comprising:

powering the controller by current from at least one of:

the battery;

the at least one electrical junction box; and the grid.

15. The method of claim 13, comprising:

determining, by the controller, the state of charge of the battery;

comparing the state of charge of the battery to a battery charge threshold;

switching the electrical current to charge the battery when the state of charge is less than the battery charge threshold.

16. The method of claim 15, comprising:

wherein the temperature threshold is less than or equal to 75° C.; and wherein the battery charge threshold is less than or equal to 16 V.

17. The photovoltaic panel system of claim 1, wherein the micro flat heat pipes are sealed under partial vacuum.

* * * * *